US006567333B2

(12) United States Patent
Toda

(10) Patent No.: US 6,567,333 B2
(45) Date of Patent: *May 20, 2003

(54) FUSE CIRCUIT USING ANTI-FUSE AND METHOD FOR SEARCHING FOR FAILED ADDRESS IN SEMICONDUCTOR MEMORY

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/173,027

(22) Filed: Jun. 18, 2002

(65) Prior Publication Data

US 2002/0191468 A1 Dec. 19, 2002

Related U.S. Application Data

(63) Continuation of application No. 09/931,024, filed on Aug. 17, 2001, now Pat. No. 6,430,101.

(30) Foreign Application Priority Data

Aug. 17, 2000 (JP) .......................................... 2000-247700
May 30, 2001 (JP) .......................................... 2001-163171

(51) Int. Cl.$^7$ ................................................ G11C 7/00
(52) U.S. Cl. ................ 365/225.7; 365/200; 365/189.07
(58) Field of Search .............................. 365/225.7, 200, 365/189.07, 207

(56) References Cited

U.S. PATENT DOCUMENTS

| | | |
|---|---|---|
| 5,334,880 A | 8/1994 | Abadeer et al. |
| 5,926,431 A | 7/1999 | Toda |
| 5,933,370 A | 8/1999 | Holzmann et al. |
| 5,959,909 A | 9/1999 | Peng et al. |
| 6,157,583 A * | 12/2000 | Starnes et al. ........... 365/225.7 |
| 6,346,738 B1 * | 2/2002 | Kim et al. .................. 257/529 |

* cited by examiner

Primary Examiner—Huan Hoang
(74) Attorney, Agent, or Firm—Banner & Witcoff, Ltd.

(57) ABSTRACT

A fuse circuit comprises first and second electric fuses, a differential amplifier and a switch circuit. The first and second electric fuses have their respective current characteristics changed when a voltage of a predetermined level or more is applied thereto. The differential amplifier receives two voltage signals based on the current characteristics of the first and second electric fuses, outputs a predetermined voltage on the basis of a difference in voltage between the two voltage signals, and amplifies the predetermined voltage. The memory circuit stores an output from the differential amplifier. The switch circuit connects and disconnects the differential amplifier to and from the memory circuit.

8 Claims, 15 Drawing Sheets

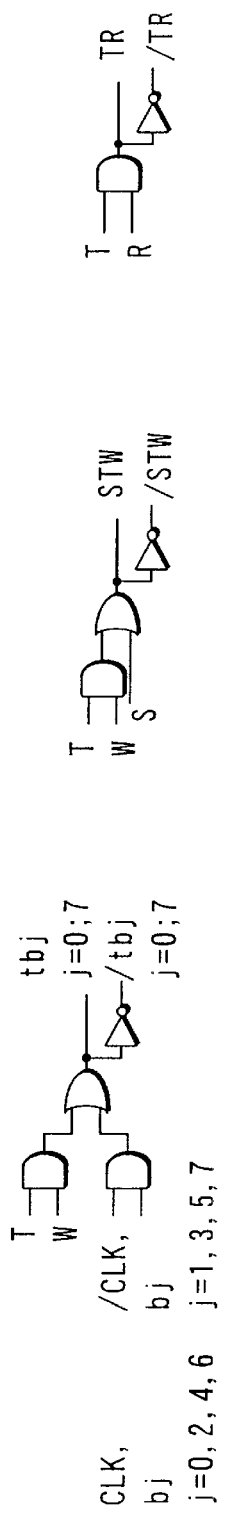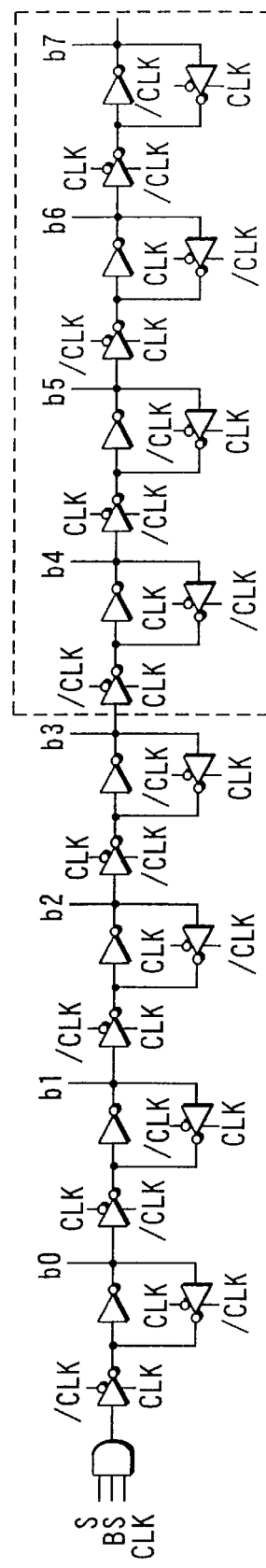

FUSE CIRCUIT USING ANTI-FUSE AND METHOD FOR SEARCHING FOR FAILED ADDRESS IN SEMICONDUCTOR MEMORY

CROSS-REFERENCE TO RELATED APPLICATIONS

This application is a continuation of U.S. Ser. No. 09/931,024, filed Aug. 17, 2001, now U.S. Pat. No. 6,430,101, which is based upon and claims the benefit of priority from the prior Japanese Patent Applications No. 2000-247700, filed Aug. 17, 2000; and No. 2001-163171, filed May 30, 2001, the entire contents of both of which are incorporated herein by reference.

BACKGROUND OF THE INVENTION

1. Field of the Invention

The present invention relates to a redundancy circuit using an anti-fuse and a method for searching for a failed address in a semiconductor memory, and more particularly to a method of this type employed in an integrated circuit such as a semiconductor memory having the redundancy circuit.

2. Description of the Related Art

When manufacturing semiconductor memories, a redundancy system for replacing failed cells with spare cells is indispensable in order to increase the yield of good products. Along conventional manufacture lines, programming is executed to replace failed cells, if found in the last stage of a semiconductor chip manufacturing process, with spare cells using a laser. The resultant semiconductor chips are packaged and subjected to a final test, and good semiconductor memory products are shipped.

However, it is still possible that one- or two-bit failed cells may be found in the final test executed after packaging. The influence of these failed cells upon the product yield cannot be ignored. In light of this, there is a demand for a programming method for replacing failed cells, found after packaging, with spare cells.

Further, in the field of semiconductor memories with various specifications concerning high-speed operation, it has become difficult to manufacture all the memories so that they can operate normally, irrespective of variations in signal transmission timing, due to variations in the precision of the elements. Therefore, timing adjustment is executed after each memory is packaged. In light of this, it is demanded to adjust the signal transmission timings of each packaged semiconductor memory by programming from the outside, and then to fix them permanently.

To meet the demands, there is a method for permanently changing the state of the circuit of each semiconductor memory, using an electric fuse system instead of a laser. The electric fuse system includes a method of using a usual fuse and a method of using an anti-fuse. In the former method, a high voltage is applied to the fuse to thereby break it and hence the wiring pattern of a semiconductor memory. In the latter method, a high voltage is applied to the anti-fuse to create a dielectric breakdown state of an insulating film between wires, i.e. make it conductive.

A description will now be given of a redundancy circuit using the anti-fuse.

FIG. 1 is a circuit diagram illustrating a redundancy circuit using an anti-fuse that consists of a capacitor.

This redundancy circuit creates a programmed state, using a difference between a capacitor in which a high voltage is applied thereto to create its dielectric breakdown state, i.e. make its resistance close to 0, and a capacitor in which no dielectric breakdown occurs whose resistance is almost infinitely great.

As shown in FIG. 1, a power voltage VDD is connected to an end of a capacitor C11 via transistor TR11. The other end of the capacitor C11 is connected to a reference potential (ground potential) GND via transistor TR12. A latch circuit LH11 is connected to a node of the capacitor C11 and the transistor TR11.

In the circuit shown in FIG. 1, if the capacitor C11 as an anti-fuse is dielectrically broken down, its resistance is close to 0, and hence the potential of the node as the input terminal of the latch circuit LH11 is close to the ground level. On the other hand, if the capacitor C11 is not dielectrically broken down, its resistance is almost infinitely great, which means that the node potential of the latch circuit LH11 is close to the power voltage level. Thus, the latching state of the latch circuit LH11 differs depending upon whether or not the capacitor C11 is dielectrically broken down. This example concerns a method of directly determining the input of the latch circuit LH11 on the basis of a difference in voltage level due to a difference in the resistance of the fuse elements.

In this method, however, unless the difference in the resistance of the anti-fuse between its breakdown state and non-breakdown state is not sufficiently large, binary data "1" and "0" to be latched by the latch circuit LH11 cannot be created reliably. In other words, in the redundancy circuit using the electric fuse system, since the breakdown state of each fuse employed in the fuse system differs depending upon the high voltage applied thereto, the programmed state of each fuse cannot be determined accurately.

BRIEF SUMMARY OF THE INVENTION

The present invention has been developed in light of the above problem and aims to provide a fuse circuit capable of accurately determining the fuse-programmed state irrespective of the breakdown state of a fuse.

The present invention also aims to provide a failed address searching method for efficiently executing the determination of a failed address, necessary for storing the fuse-programmed state in the fuse circuit.

To satisfy the aims, according to a first aspect of the present invention, there is provided a fuse circuit comprising: first and second electric fuses having respective current characteristics changed when a voltage of a predetermined level or more is applied thereto; a differential amplifier for receiving two voltage signals based on the current characteristics of the first and second electric fuses, and outputting a predetermined voltage on the basis of a difference in voltage between the two voltage signals; a memory circuit for storing an output from the differential amplifier; and a switch circuit for connecting and disconnecting the differential amplifier to and from the memory circuit.

To satisfy the aims, according to a second aspect of the present invention, there is provided a fuse circuit comprising: first and second electric anti-fuses having respective leak current characteristics changed when a voltage of a predetermined level or more is applied thereto; a differential amplifier for receiving two voltage signals based on the leak current characteristics of the first and second electric anti-fuses, and outputting a predetermined voltage on the basis of a difference in voltage between the two voltage signals; a memory circuit for storing an output from the differential amplifier; and a switch circuit for connecting and disconnecting the differential amplifier to and from the memory circuit.

To satisfy the aims, according to a third aspect of the present invention, there is provided a fuse circuit comprising: a fuse bit storing circuit having a pair of electric fuses for storing bit information used to determine a circuit operation state, the pair of electric fuses having a first and second electric fuses; a programming control circuit for applying a voltage of a predetermined level or more to one of the electric fuses to thereby make current characteristic states of the electric fuses unbalanced, thereby programming, in the fuse bit storing circuit, the bit information for determining the circuit operation state; a differential amplifier for receiving outputs of the electric fuses and amplifying the unbalanced current characteristic; a memory circuit for storing an output of the differential amplifier; a switch circuit for connecting and disconnecting the differential amplifier to and from the memory circuit; and a detection control circuit for detecting the bit information for determining the circuit operation state programmed in the fuse bit storing circuit.

In the fuse circuit constructed as above, a voltage of a predetermined level or more is applied to one of the electric fuses to thereby make the current characteristic states of the electric fuses unbalanced, and the unbalanced current characteristic states are detected by the differential amplifier. As a result, the programmed states of the first and second electric fuses can be determined accurately irrespective of their breakdown states.

Further, to satisfy the aims, according to a fourth aspect of the present invention, there is provided a failed-address searching method for use in a semiconductor memory that includes a plurality of banks each having a plurality of memory cells provided common address among the plurality of banks, and a plurality of I/O terminals provided for each of the banks for inputting and outputting data to and from the memory cells of the each bank, comprising: reading a plurality of data on the basis of the common address among the banks and the I/O terminals, thereby detecting a failed address of a memory cell storing failed data; and inputting the detected failed address and reading data corresponding to the failed address from each memory cell of the banks, thereby determining that one of the banks which contains the memory cell storing failed data, and that one of the I/O terminals which inputs and outputs data to and from the memory cell storing failed data.

In the above-described failed-address searching method, a plurality of data items are read on the basis of the common address of a plurality of banks and I/O terminals, and subjected to a computing operation, thereby detecting a failed address from the computing operation result and determining the bank including a failed cell and the I/O terminal connected thereto. As a result, a failed address necessary for storing a fuse-programmed state in the fuse circuit can be determined efficiently.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 17A–17E are circuit diagrams illustrating switching of data buses for executing the normal mode, the reduction test mode and the search mode shown in FIG. 15;

DETAILED DESCRIPTION OF THE INVENTION

The present invention is applicable to a redundancy circuit that employs an electric fuse for permanently and electrically changing the state of a circuit, e.g. a usual fuse or an anti-fuse. The usual fuse is used to apply a high voltage to the circuit to thereby break its wiring pattern and create a disconnected state. On the other hand, the anti-fuse is used to apply a high voltage to the circuit to thereby dielectrically break down an insulating film between wire layers in the circuit and create a conductive state.

[First Embodiment]

A description will now be given of programming of anti-fuses and their state detection in a first embodiment.

Figure 1:
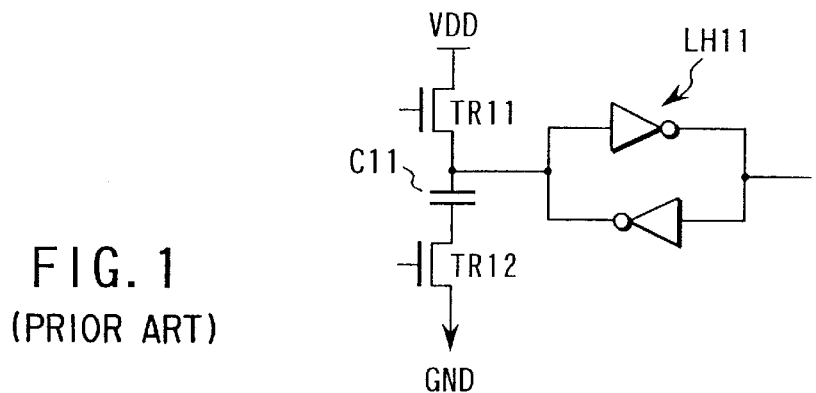
FIG. 1 is a circuit diagram illustrating a conventional anti-fuse structure using a capacitor.
Figure 2:
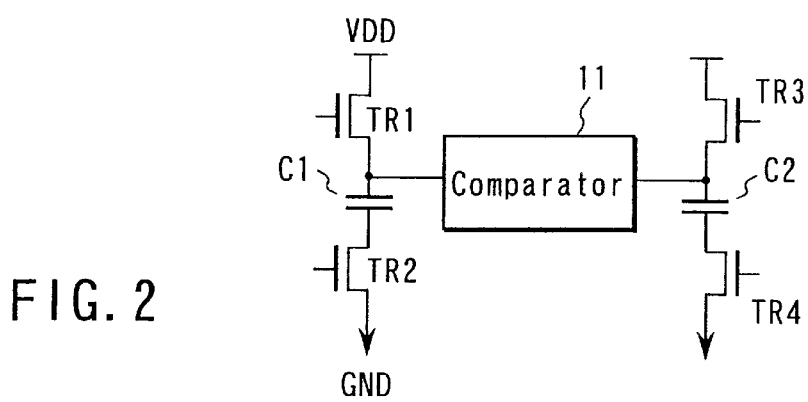
FIG. 2 is a circuit diagram illustrating a circuit including basic anti-fuses and used for detecting the states of the fuses, according to a first embodiment of the invention.

FIG. 2 is a circuit diagram illustrating basic anti-fuses and a state detection circuit for the anti-fuses, employed in the first embodiment.

As shown in FIG. 2, a fuse unit comprising the anti-fuses and the state detection circuit incorporates capacitors C1 and C2 used as the anti-fuses, a comparator 11 and n-channel MOS transistors TR1–TR4.

One end of the capacitor C1 is connected to one end of the current path of the transistor TR1. The other end of the current path of the transistor TR1 is connected to a power voltage VDD. The other end of the capacitor C1 is connected to one end of the current path of the transistor TR2. The other end of the current path of the transistor TR2 is connected to a reference potential (e.g. ground potential) GND.

One end of the capacitor C2 is connected to one end of the current path of the transistor TR3. The other end of the current path of the transistor TR3 is connected to the power voltage VDD. The other end of the capacitor C2 is connected to one end of the current path of the transistor TR4. The other end of the current path of the transistor TR4 is connected to the reference potential (e.g. ground potential) GND.

Further, the comparator 11 is connected between the one end of the capacitor C1 and the one end of the capacitor C2.

In the fuse unit comprising the anti-fuses and their state detection circuit, the comparator 11 compares the outputs of the capacitors C1 and C2 as the anti-fuses.

This single fuse unit programs one-bit data such as a redundancy address.

In the circuit constructed as shown in FIG. 2, load such as a high voltage is applied to only one of the capacitors C1 and C2 to be compared by the comparator 11, thereby dielectrically breaking down the one capacitor. This breakage is not necessarily a complete one, but it is sufficient if the leak current slightly increases. In other words, it is sufficient if a small potential difference, which can be detected by the comparator 11, occurs between the capacitor to which electrical power is applied and the other capacitor to which no electrical power is applied.

Depending upon whether the electrical power is applied to the capacitor C1 or C2, the programmed state of the fuse unit can be expressed by "0" or "1".

Thus, even if a high load that makes the resistance of an anti-fuse (the capacitor C1 or C2) close to 0 is not applied to the anti-fuse, the fuse programming can be made. This means that stable programming can be executed irrespective of variations in the breakdown state due to the load applied.

The fuse unit having the anti-fuses and their state detection circuit will be described.

Figure 3:
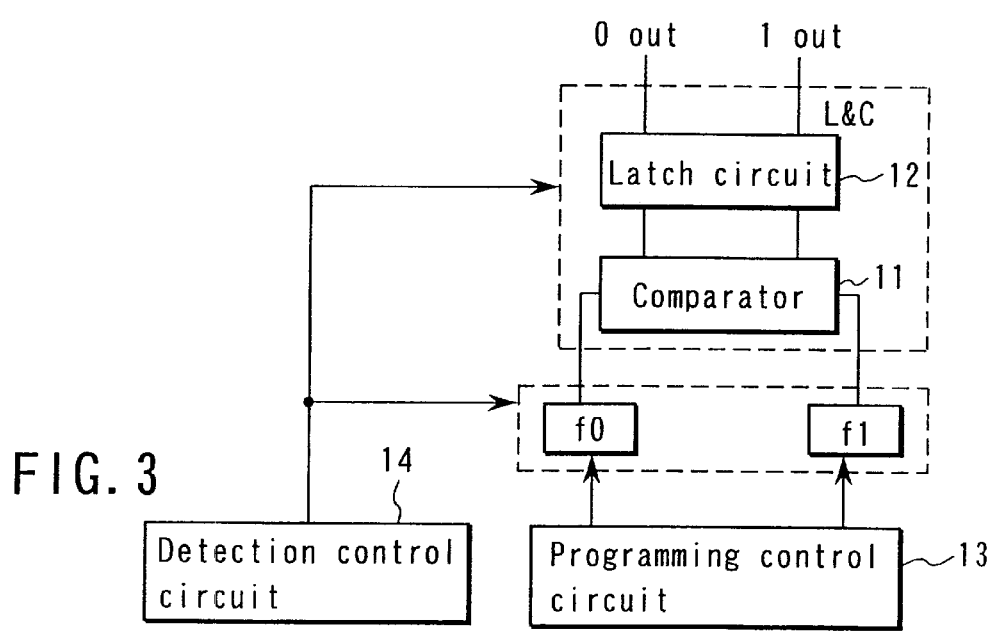
FIG. 3 is a block diagram illustrating a fuse unit having the state detecting circuit.

FIG. 3 is a block diagram showing the structure of the fuse unit.

As seen from FIG. 3, anti-fuse circuits f0 and f1 are connected to a comparator 11, which is connected to a latch circuit 12. The anti-fuse circuits f0 and f1 are also connected to a programming control circuit 13 and a fuse-enable-control circuit 14. The fuse-enable-control circuit 14 is also connected to the latch circuit 12.

The operation of the fuse unit shown in FIG. 3 will be described.

The comparator 11 compares the outputs of the anti-fuse circuits f0 and f1. The latch *circuit 12 latches the comparison result output from the comparator 11. The programming control circuit 13 is designed to program the anti-fuse circuits f0 and f1. The fuse-enable-control circuit 14 is designed to execute control for detecting the programmed results of the anti-fuse circuits f0 and f1. The outputs O out and 1 out are used for redundancy address control.

Figure 4:
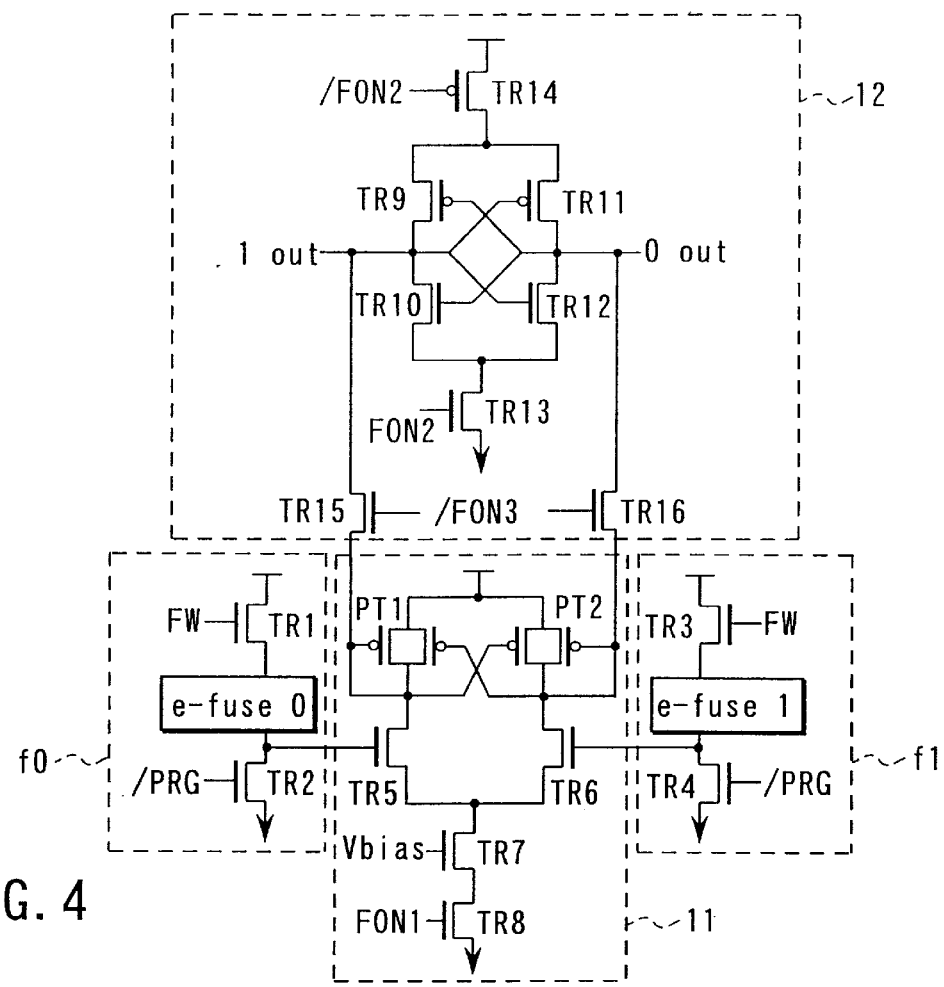
FIG. 4 is a circuit diagram showing an anti-fuse circuit, a comparator and a latch circuit incorporated in the fuse unit shown in FIG. 3.

FIG. 4 shows in more detail the anti-fuse circuits f0 and f1, the comparator 11 and the latch circuit 12, which appear in FIG. 3.

Fuses e-fuse 0 and e-fuse 1 are formed of elements, such as capacitors, which degrade and increase their leak currents when electrical power is applied thereto. In order to compare its leak current using data items "0" and "1", the fuse e-fuse 0 is connected to the power voltage VDD and the ground potential GND respectively via n-channel MOS transistors TR1 and TR2 for converting the leak current into a voltage. Similarly, in order to compare its leak current using data items "0" and "1", the fuse e-fuse 1 is connected to the power voltage VDD and the ground potential GND respectively via n-channel MOS transistors TR3 and TR4 for converting the leak current into a voltage.

When comparing the leak currents of the anti-fuse circuits f0 and f1, both the VDD-side and GND-side transistors TR1–TR4 are turned on. Voltage levels based on the leak currents of the fuses e-fuse 0 and e-fuse 1 are used as the input levels of the comparator 11.

A signal FW is input to the gates of the VDD-side transistors TR1 and TR3, while a signal /PRG is input to the gates of the GND-side transistors TR2 and TR4. The signal FW is at "H" while the comparator 11 compares the states of the fuses e-fuse 0 and e-fuse 1 and the latch circuit 12 latches the comparison result. The signal /PRG is at "L" only when electrical power is applied to the fuse e-fuse 0 or e-fuse 1 for programming.

The comparator 11 is a differential amplifier having transistors TR5 and TR6. The comparator 11 also includes transistor TR7 using signal Vbias as its gate input and used to flow a constant current, and GND-side transistor TR8 serving as a switch for operating the comparator 11 only when signal FON1 is at "H". The comparator 11 further includes pass transistors PT1 and PT2.

The latch circuit 12 comprises transistors TR9–TR14 and transistors TR15 and 16 for connecting it to the comparator 11 and disconnecting it therefrom.

The circuit constructed as shown in FIG. 4 operates as follows:

The comparator 11 compares the levels of the anti-fuse circuits f0 and f1 and amplifies the comparison result. The amplified comparison result is output from the comparator 11 and latched by the latch circuit 12. At this time, the comparator 11 and the latch circuit 12 are switched by the transistors TR15 and TR16 that use signal /FON3 as their gate input. After the latch circuit 12 latches data from the comparator 11, the signal /FON3 is at "L", thereby disconnecting the latch circuit 12 from the comparator 11.

The latch circuit 12 is a dynamic latch circuit for latching the output of the comparator 11 when signal FON2 is at "H" and signal /FON2 is at "L", while amplifying the output. In accordance with the comparator output, it is determined whether the output Oout (or 1out) of the latch circuit 12 is the power voltage or the ground potential.

A description will be given of the fuse-enable-control circuit 14 that generates a signal for controlling the circuit of FIG. 4.

Figure 5A:
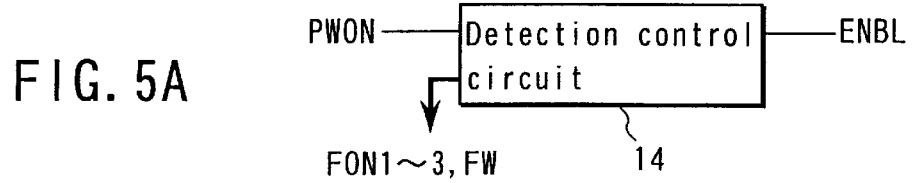
FIGS. 5A, 5B and 5C are circuit diagrams showing a fuse-enable-control circuit incorporated in the fuse unit of FIG. 3.
Figure 5B:
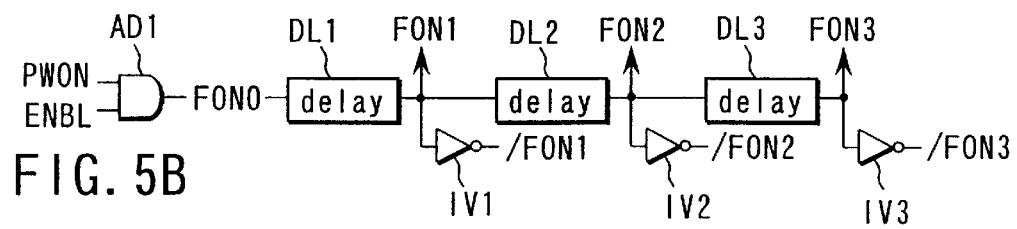
Figure 5C:

FIGS. 5A, 5B and 5C are circuit diagrams showing the fuse-enable-control circuit 14 appearing in FIG. 3.

As shown in FIG. 5A, the fuse-enable-control circuit 14 receives signals PWON and ENBL and outputs signals FON1, FON2, FON3 and FW.

Referring then to FIGS. 5B and 5C, the fuse-enable-control circuit 14 will be described in more detail. As shown in FIG. 5B, the signals PWON and ENBL are input to an AND circuit AD1. Signal FON0 output from the AND circuit AD1 is delayed by delay circuit DL1, thereby outputting signal FON1. The signal FON1 is inverted by inverter IV1, thereby outputting complementary signal /FON1.

The signal FON1 is also delayed by delay circuit DL2, thereby outputting signal FON2. The signal FON2 is inverted by inverter IV2, thereby outputting complementary signal /FON2.

The signal FON2 is also delayed by delay circuit DL3, thereby outputting signal FON3. The signal FON3 is inverted by inverter IV3, thereby outputting complementary signal /FON3.

Furthermore, as shown in FIG. 5C, the signals FON3 and FON0 are input to AND circuit AD2. The output of the AND circuit AD2 is input to a first terminal of NOR circuit NR1, while the complementary signal /ENBL of the signal ENBL is input to a second terminal of the NOR circuit NR1. The signal FW is output from the NOR circuit NR1.

The fuse-enable-control circuit 14 operates as follows:

The programmed states of the fuses e-fuse are detected when the device chip is turned on. At this time, the detection of the programmed states is started at a point in time at which the signal PWON, which is arranged to rise after the voltage applied to the chip is substantially stabilized, rises. The signal ENBL is set at "H" when detecting the programmed bit and using it as redundancy information. Accordingly, after the signals PWON and ENBL are raised to "H", the fuse-enable-control circuit 14 starts to operate.

As aforementioned, in the fuse-enable-control circuit 14, the signal FON0 is converted by the delay circuit DL1 into the signal FON1, which is converted by the inverter IV1 into the signal /FON1. The signal FON1 is converted by the delay circuit DL2 into the signal FON2, which is converted by the inverter IV2 into the signal /FON2. Furthermore, the signal FON2 is converted by the delay circuit DL3 into the signal FON3, which is converted by the inverter IV3 into the signal /FON3.

The signal FW is set at "H" when the signal ENBL is at "H" and the signals FON0 and FON3 are at "L". At this time, the bit data items of the fuses e-fuse 0 and e-fuse 1 are output to the comparator 11. After the signal FON3 rises to thereby disconnect the comparator 11 from the latch circuit 12, the signal FW is set at "L" and the signal input to the comparator 11 is set at the GND level. In this state, no current flows into the comparator 11, i.e., no power is consumed in the comparator 11.

Figure 6:
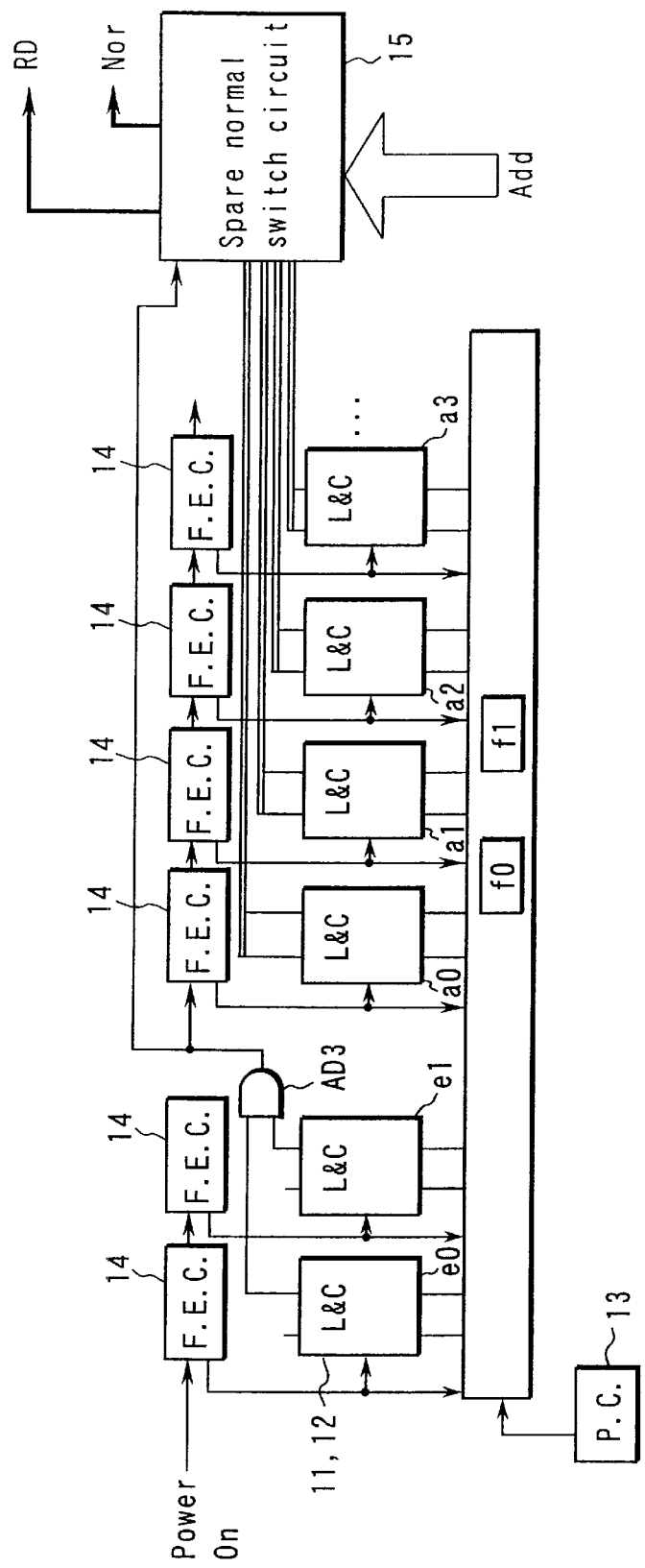
FIG. 6 is a block diagram showing a fuse system having the fuse unit of FIG. 3.

To create a fuse system for detecting, from the fuse unit shown in FIG. 3, an address assigned to a failed cell to be replaced with a spare cell (hereinafter referred to as a "redundancy address" or a "failed address"), one fuse unit is necessary for each bit of one address. Further, since the bit of each fuse is always "0" or "1", another bit that indicates a case where no address is set is necessary. Referring now to FIG. 6, an example of a fuse system having these elements will be described.

FIG. 6 is a block diagram illustrating the fuse system. In this figure, "P.C." denotes the programming control circuit 13, "F.E.C." the fuse-enable-control circuit 14, and "L&C" the combination of the latch circuit 12 and the comparator 11 (units a0–a3). Although the figure shows only one pair of anti-fuse circuits f0 and f1, a pair of anti-fuse circuits f0 and f1 may be employed for each unit a0–a3.

Each bit of a failed address, which is to be replaced with a redundancy or spare cell, is expressed by a bit output from the unit a0. Bits output from units e0 and e1 determine whether or not bits output from the units a0, . . . are used to express an address. Only when bit data "1" is set in the units e0 and e1, and the AND circuit AD3 has output "H", the bits output from the unit a0, . . . are arranged to be valid. In the other cases, no programmed-state detection is executed on the units a0, . . . , thereby minimizing the consumption of power for the detection.

If the fuse system is valid (i.e. if the bits output from the units a0, . . . are valid), an address bit signal Add supplied from the outside is compared with the bits of a failed address. In accordance with this comparison result, a spare normal switch circuit 15 determines to select a path RD for selecting a redundancy cell, or a path Nor for selecting no redundancy cell.

Detection in units of one bit in the fuse system shown in FIG. 6 is executed sequentially, beginning from the unit e0. First, after the power switch is turned on, the first-stage fuse-enable-control circuit 14 shown in FIGS. 5A–5C determines the bit of the unit e0. In response to the output of the first-stage fuse-enable-control circuit 14, the second-stage fuse-enable-control circuit 14 determines the output of the unit e1. At this time, the AND circuit AD3 calculates the logical sum of the outputs of the units e0 and e1. The output of the AND circuit AD3 drives the fuse-enable-control circuits 14 for the units a0, . . . . Accordingly, if at least one of the units e0 and e1 is "O", no detection operation is executed on the units a0, . . . . In this case, the spare normal switch circuit 15 always selects the path Nor. On the other hand, if data "1" is set in both the units e0 and e1, the bits of the units a0, . . . are detected and determined, thereby determining the bits of a failed address.

A method for programming the fuse system will be described.

In the case shown in FIG. 2, the anti-fuse circuits f0 and f1 are each formed of one capacitor. If each capacitor consists of a cell capacitor, the capacitors for all the bits of the fuse system of FIG. 6 can be formed in a cell array.

Figure 7:
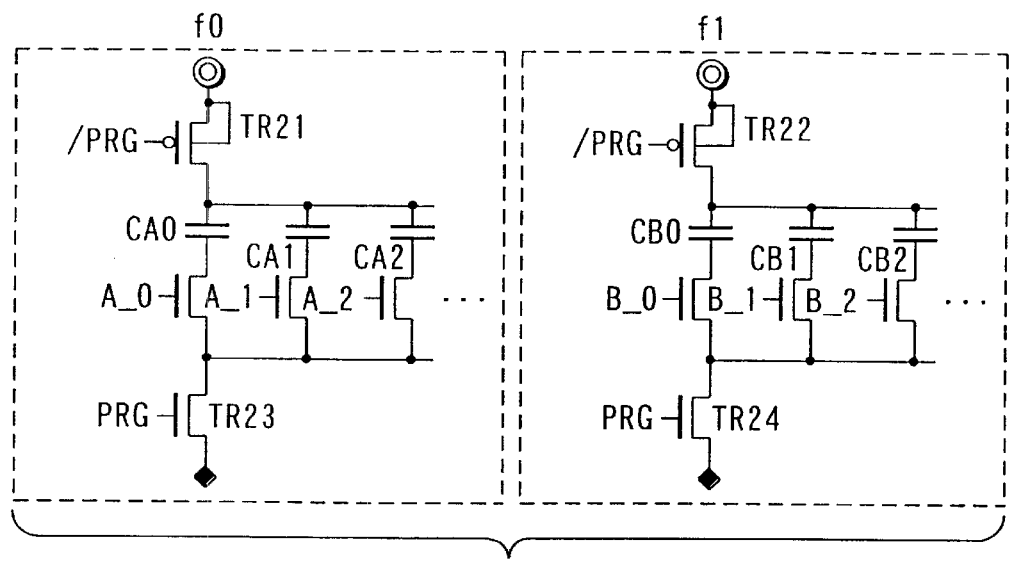
FIG. 7 is a circuit diagram that includes blocks e-fuse 0 and e-fuse 1 appearing in FIG. 4 and used as cell arrays.

FIG. 7 is a circuit diagram illustrating anti-fuse circuits f0 and f1 as shown in FIG. 4 but formed in cell arrays. The anti-fuse circuits f0 and f1 formed of the cell arrays are commonly used for the all fuse units as shown in FIG. 6. Addresses (transfer gate transistor) A_0, A_1, B_0, B_1, . . . corresponding to, for example, the bits of the units e0, e1, a0, a1, . . . shown in FIG. 6 are set for word line transfer gate transistors of the cell capacitor array. In this cell array, capacitors CA0, CA1, . . . , CB0, CB1, are used as anti-fuses, and one of or both the addresses A_i and B_i are selected in synchronism with the programming or detecting operation of each unit i when programming or detecting the bits of the anti-fuses.

When executing the programming operation, electrical power is applied to the fuse f0 or f1 of each unit as a result of the selection of one of the addresses A_i and B_i. On the other hand, when executing the detection, the units can receive respective comparator inputs as a result of the selection of both the addresses A_i and B_i.

Signal PRG assumes "H" in programming mode, and signal /PRG is its complementary signal. For example, in order to apply a high electrical power to the anti-fuse circuit f0 or f1, p-channel transistors TR21 and TR22, to which the signal /PRG is input, are connected to an internal voltage equal to or higher than the power voltage. N-channel transistors TR23 and TR24, to which the signal PRG is input, are connected to an internal voltage equal to or lower than the ground potential.

Figure 8A:
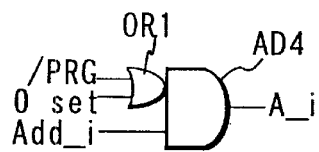
FIGS. 8A and 8B are circuit diagrams illustrating a program control circuit for programming the anti-fuse circuit shown in FIG. 3.
Figure 8B:
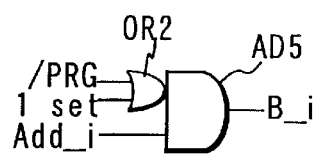

FIGS. 8A and 8B are circuit diagrams illustrating the programming control circuit 13 for programming the anti-fuse circuits f0 and f1 shown in FIG. 3 or 6.

The programming control circuit 13 generates the aforementioned addresses A_i and B_i. In the circuit 13, the signal /PRG is input to a first terminal of OR circuit OR1, while signal Oset is input to a second terminal of the OR circuit OR1. Further, the output of the OR circuit OR1 is input to a first terminal of AND circuit AD4, and signal Add_i is input to a second terminal of the AND circuit AD4. The AND circuit AD4 outputs a signal to be supplied to the gate of transfer gate transistor A_i.

Further, the signal /PRG is input to a first terminal of OR circuit OR2, while signal 1set is input to a second terminal of the OR circuit OR2. Further, the output of the OR circuit OR2 is input to a first terminal of AND circuit AD5, and the signal Add_i is input to a second terminal of the AND circuit AD5. The AND circuit AD5 outputs a signal to be supplied to the gate of transfer gate transistor B_i.

The signal Add_i indicates the position of each bit unit shown in FIG. 6. When setting "O" in a certain unit indicated by the signal Add_i, the signal Oset is set at "H" and the signal 1set is set at "L". When setting "1" in the unit, the signal Oset is at "L" and the signal 1set is at "H".

When executing the detection operation, the signal /PRG is at "H", and hence both corresponding addresses A_i and B_i are generated and the capacitors serving as anti-fuses are separated from the stress-causing power supply in FIG. 7. At this time, if the signal /PRG is input in place of the signal ENBL in FIGS. 5A–5C, the transistors to which the signal FW is input, shown in FIG. 4, are turned off in programming mode, thereby disconnecting the power voltage from a high internal voltage.

In the above-described fuse system, the fuses must be programmed irrespective of whether or not a redundancy cell is used. Further, in order to prevent the erroneous determination that a redundancy cell is being used, a bit structure is contrived. In this bit structure, more than two determination bit units (e.g. the units e0 and e1) are provided for determining whether or not the fuse system is being used. The use of the fuse system is determined only when the bit obtained by logical multiplication (AND) of the two bits is valid. This structure uses the fact that the probability that the bit obtained by logical multiplication (AND) of the two bits is valid accidentally is very low. The determination using logical multiplication may be executed to determine the use of the fuse system or to determine the non-use of the fuse system. In this embodiment, the determination is executed to determine the use of the fuse system. Furthermore, a predetermined bit pattern may be used in place of the logical multiplication.

Figure 9:
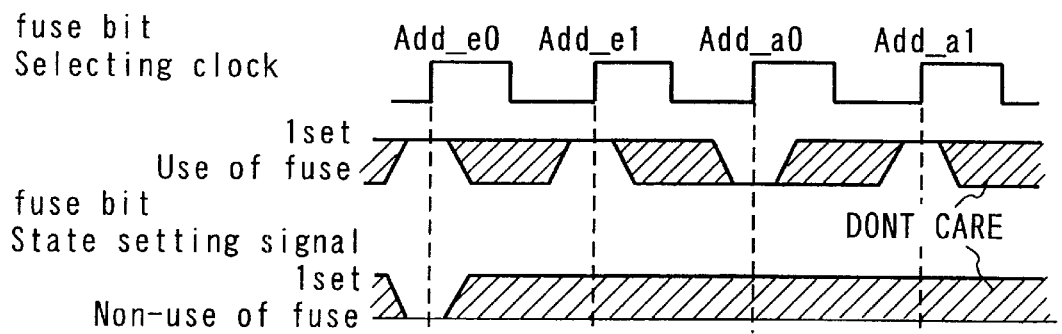
FIG. 9 is a timing chart useful in explaining the signal states of the anti-fuse circuit assumed at the time of programming.

FIG. 9 shows the programmed signal states of the anti-fuse circuits f0 and f1 according to the embodiment.

In synchronism with the leading edge of a fuse bit selecting clock pulse, selecting address signals Add_e0, Add_e1, Add_a0, Add_a1 . . . . are supplied to select a transfer gate A_i or B_i in a memory cell array, as an anti-fuse. In addition to these signals, the signal 1set or 0set (/1set) as a fuse bit state setting signal, shown in FIGS. 8A and 8B, is supplied. FIG. 9 shows a case where the signal 1 set is supplied.

When using a fuse as a redundancy cell, data "1" is set in the units e0 and e1, thereby sequentially programming the units a0, . . . as failed address bits. If no fuses are used as redundancy cells, it is sufficient if data "0" is set in one of the units e0 and e1. In the case of FIG. 9, "0" is set in the unit e0. The other units may have any one of "0" and "1".

In FIG. 6, for example, although the bits of the units 0a, . . . are used as the bits of a failed address, they may be used as, for example, bit information for subtle timing adjustment for setting up or holding the circuit.

As described above, the first embodiment can accurately determine the programmed states of electric anti-fuses irrespective of variation in their breakdown state. Furthermore, the anti-fuses can be made without any additional process, thereby creating a highly reliable redundancy circuit.

Also, this embodiment can reliably determine the programmed states of electric anti-fuses, which are formed of elements incorporated in a DRAM, i.e., which are manufactured by a usual DRAM manufacturing process and without any additional process.

In particular, in DRAMs, since each memory cell has a capacitor, each anti-fuse can be formed of the capacitor. This means that no extra process for forming the anti-fuse is required. It is a matter of course that any element other than the capacitor can be used to form the anti-fuse, if its resistance can be reduced by dielectric breakdown.

However, when using an element such as a DRAM cell as the anti-fuse, it should be noted that the DRAM cell manufacturing process has been improved so that the insulating film of each cell will not degrade even if a high voltage is applied thereto, thereby enhancing the reliability of the cell. Accordingly, the insulating film is hard to break, and hence a large difference in the resistance of the insulating film cannot be created between the time of breakdown and the time of non-breakdown. In particular, this feature is disadvantageous to an electric fuse system used, after a stable manufacturing process, for saving the last one or two failed bits.

Therefore, in the above case, it is necessary to form an element to be used as an anti-fuse, by adding an extra process to the usual DRAM cell manufacturing process. However, this inevitably increases the cost. The first embodiment of the present invention is especially effective in such a case as above, in which a large difference in resistance cannot be created between the time of breakdown and the time of non-breakdown.

[Second Embodiment]

One of the objects of the above-described anti-fuse system is to save a small number (e.g. 1 or 2) of failed bits in a device chip after packaging the chip, thereby increasing the yield of good products and reducing the manufacturing cost of the good products. In the case of a conventional fuse to be melted by a laser, the fuse system cannot be used after packaging. In this point, the anti-fuse system of the first embodiment is very advantageous.

Further, in a large memory capacity device, a lot of time is required to detect a failed address. In this case, the ratio of good products per unit of time is reduced, thereby increasing their manufacturing cost. In light of this, it is necessary to contrive a method for efficiently detecting one or two failed cell bits after packaging.

Figure 10:
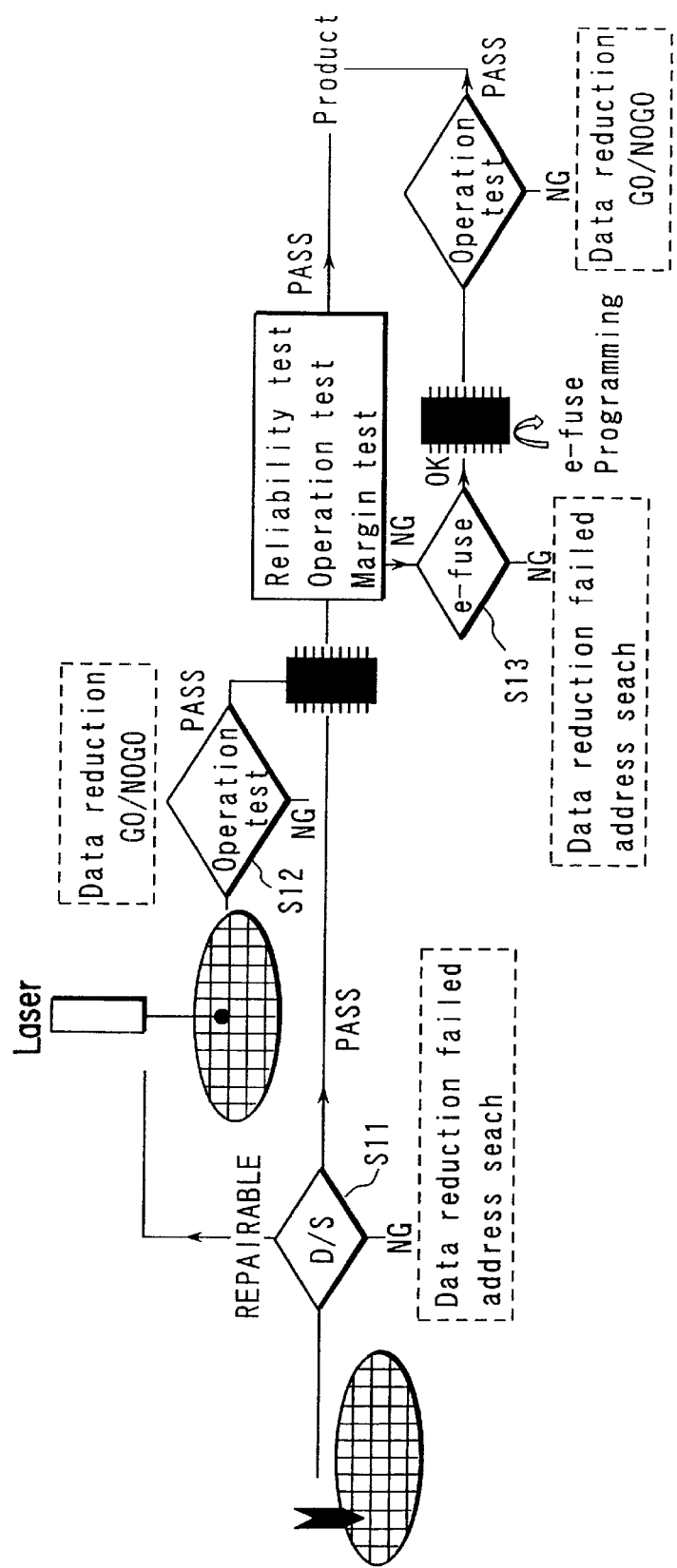
FIG. 10 is a view useful in explaining a process executed in a good product acquiring/inspecting system, in which a data-reducing failed-cell-address-searching method according to a second embodiment is used.

FIG. 10 is a view illustrating a work area in which a good product inspection system using the above-described fuses e-fuse and a data-reducing failed-cell-address-searching method according to the invention are used.

When using a redundancy cell, it is necessary to detect a failed address. To reduce the time required for testing for the detection, it is necessary to detect failed cells by a test using data reduction or data compression, and then to restore the reduced or compressed data to the original data so as to search the actual address of the failed cells. For failed address searching, a data-reducing failed-cell-address-searching method according to a second embodiment of the invention is used.

Specifically, when executing a redundancy test using a laser during die sorting (D/S), the aforementioned searching method is used to sort semi-products into those that can be completed as good products, and the others that cannot be completed as good products (step S11). The searching method is also used to determine the address of one or two failed bits or bits whose signal timing should be adjusted, which have been detected in, for example, a reliability test executed after packaging a good product having passed through the test in the die sorting process, and which can be saved by the fuses e-fuse (step S13). The method is also used to determine the address of one or two failed bits or to-be-timing-adjusted bits, which have been detected in, for example, a reliability test executed after packaging a product having passed through an operation test (step S12) after redundancy processing using a laser, and which can be saved by the fuses e-fuse (step S13).

In data reduction GO/NOGO, it is not necessary to determine a failed address for many fails, but any failed chip is immediately discarded. In the replaceable fail cases, however, it is important to restore reduced data to original data and search a failed address as soon as possible.

A description will now be given of a failed address searching method, according to the second embodiment, for determining a failed address necessary for programming the anti-fuse circuits f0 and f1.

Concerning data reduction, a method has been invented for reducing the bit width in a memory chip used for data simultaneous reading, thereby increasing the number of chips that can be simultaneously measured, and hence increasing the number of chips that can be tested within a certain time period. In other words, the number of chips that can be simultaneously measured has been increased by reducing the number of I/O terminals used for parallel data exchange between a test device and the chips, thereby increasing the number of chips that can simultaneously transfer data during a test.

In order to further reduce the time required for testing a large capacity memory chip, it is necessary to minimize the time for testing each section of the chip (supposing that the chip consists of a plurality of sections having a small capacity). Moreover, in accordance with the development of techniques for replacing failed cells with redundancy cells after the packaging process, it has come to be important to determine the position of a failed cell.

In light of these circumstances, it is necessary to find out a method for maximizing the data transfer efficiency in consideration of the burst length, the number of banks and the number of I/O terminals to be reduced, when executing data reduction in the reduction test. It is also necessary to find out a method for searching for the address of failed cells, in combination of the reduction test.

Suppose that the clock cycle is 100 MHz and DDR (Double Data Rate) is employed. A method for preventing the increase of the number of data bus signal lines in a chip must be found in order to avoid the increase of the chip cost due to the above tests.

Provided that the number of data transfer buses in a chip is not changed even in reduction test mode, what kind of reduction steps can be taken? Suppose that the number of I/O terminals to be reduced is represented by i (after the same data is written into a number i of I/O terminals, data items stored therein are read and the Exclusive OR (XOR) of the read data items is used as a single data item), the number of banks to be reduced is represented by b (in the same meaning as the I/O reduction, a number b of banks are simultaneously operated as if they constituted one bank), and the burst length of the data is represented by B.

A failed-cell-address-searching method could be devised in which reduced data can be accessed by burst access, thereby realizing high-speed searching of a failed address. In this method, however, the range that enables the reduction test to be executed is limited for the following reason.

In the second embodiment, which reduced data item differs from a predetermined expected value is searched from data items arranged in order such that their total bit width corresponds to the burst length in the SDRAM. However, to restore reduced data on a failed address to original data such that its total bit width corresponds to the burst length B, the relationship expressed by the following equation need be satisfied:

$$b \cdot i = B$$

where b represents the number of to-be-reduced banks, and i the number of to-be-reduced I/O terminals, as aforementioned.

On the other hand, in the prior art, different banks do not simultaneously transfer data, and a single bus is used in a time division manner. To transfer reduced data items in a parallel manner without changing the number of buses employed in the chip, it is necessary for the reduced banks to use the buses in a parallel manner. Unless the reduced I/O terminals are arranged to be used as non-busy buses so as to satisfy $b \leq i$, the number of buses must be increased. Accordingly, the relationship between the reduced number of the I/O terminals and the burst length is expressed by $$b \cdot b \leq B \leq i \cdot i$$

Since the burst length B of the SDRAM is 4 or 8, four reduction methods recited in the following Table 1 can be employed if the number of buses is unchanged even in reduction test mode.

TABLE 1

| B | 4 | | 8 | |
|---|---|---|---|---|
| b | 1 | 2 | 1 | 2 |
| i | 4 | 2 | 8 | 4 |

If the number b of to-be-reduced banks is set at a large number, the number of I/O terminals in each chip cannot be reduced in test mode. In this case, however, the amount of data to be transferred in a parallel manner is increased, and hence the time required for testing each chip can be shortened. On the other hand, if the number i of to-be-reduced I/O terminals is set at a large number, the time required for testing each chip cannot be shortened although the number of I/O terminals in each chip can be reduced. In other words, the number of chips that can be tested per unit of time may not be changed simply by changing the method between the method of reducing the time required for testing one chip and the method of increasing the number of chips to be tested simultaneously.

The relationship between interleaved operations of data input and output using a plurality of banks and the burst length will be described to clarify the transfer efficiency of data.

Figure 11:
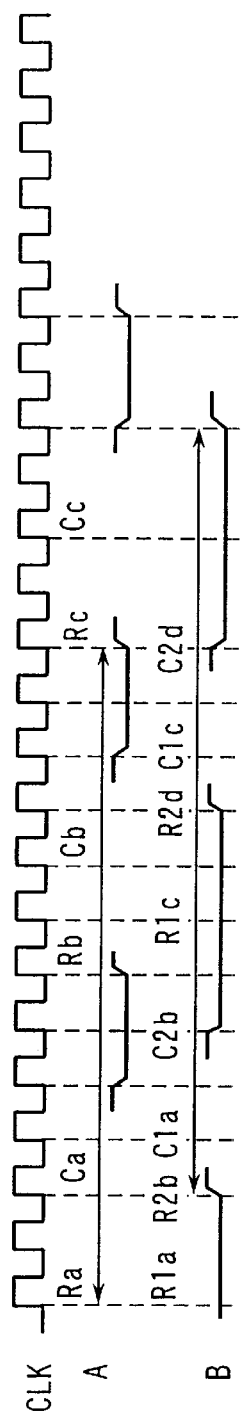
FIG. 11 is a timing chart useful in explaining cases according to the second embodiment, i.e. a case where the burst length is set at 4 and data input/output operations using banks are interleaved, and a case where the burst length is set at 4 and no data input/output operations using the banks are interleaved.

FIG. 11 shows case A where no data input/output operations are interleaved with the burst length set at 4, and case B where data input/output operations using a plurality of banks in a parallel manner are interleaved with the burst length set at 4.

In the cases shown in FIG. 11, DDR is used and tRCD and CL are both set at 2. "tRCD" indicates the minimum number of cycles of the clock pulse signal used, which enables the input of a column address C of a bank after the input of a row address R of the bank. "CL" indicates the number of cycles of the clock pulse signal necessary to output data stored in the bank after the input of the column address C. Further, since case A indicates a case where only a single bank is accessed, Ra indicates the address of row a in the bank, while Ca indicates the leading column address of data output in burst mode. On the other hand, in case B, two banks are used in a parallel manner and data input/output operations are interleaved. Accordingly, reference numerals 1 and 2 are further attached to, for example, Ra and Ca of the respective banks.

Figure 12:
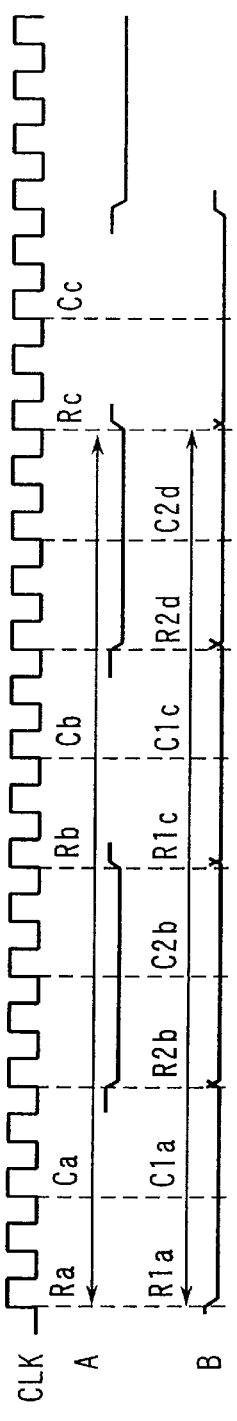
FIG. 12 is a timing chart useful in explaining cases according to the second embodiment, i.e. a case where the burst length is set at 8 and data input/output operations using banks are interleaved, and a case where the burst length is set at 8 and no data input/output operations using the banks are interleaved.

FIG. 12 shows case A where no data input/output operations are interleaved with the burst length set at 8, and case B where data input/output operations using a plurality of banks in a parallel manner are interleaved with the burst length set at 8.

In this case, it is supposed that the output is obtained by reducing data using the Exclusive OR (XOR) operation. If there is no failed data, "L" is output. In the same manner as in FIG. 11, case A indicates a case where only a single bank is accessed, Ra indicates the address of row a in the bank, and Ca indicates the leading column address of data output in burst mode. Case B indicates a case where two banks are used in a parallel manner and operations of data input and output are interleaved. Accordingly, reference numerals 1 and 2 are further attached to, for example, Ra and Ca of the respective banks.

The following Table 2 shows variations in the average amount of data transfer per one I/O terminal in one cycle of the clock pulse signal.

TABLE 2

| | Interleaved operations | When no reduction is executed | When reduction is executed |
|---|---|---|---|
| Burst length 4 | No (A of FIG. 11) | 8/12 = 0.67 | — |
| | Yes (B of FIG. 11) | 16/14 = 1.14 | 16 × 4/14 = 4.57 |
| Burst length 8 | No (A of FIG. 12) | 16/16 = 1 | — |
| | Yes (B of FIG. 12) | 32/16 = 2 | 32 × 8/16 = 16 |

In Table 2, the denominator of each fraction indicates the number of cycles of the clock pulse signal, while the numerator indicates the number of bits of data to be transferred in the cycles. Thus, the number of data bits to be transferred is calculated by dividing the data bits to be transferred by the number of cycles of the clock pulse signal. Further, in the case of the SDRAM including four banks, since the device has at least two banks even after bank reduction is executed, operations of data input and output can be interleaved. Therefore, in the case where data input/output operations are interleaved, Table 2 only shows the amount of data transfer obtained when bank reduction is executed. Furthermore, the amount of reduction is determined so that the total bit width of restored data corresponds to the burst length.

It is a matter of course that the effect of reduction is greater when the burst length is set at 8 than when it is set at 4, since in the former case, no gap occurs between burst cycles. In the case of the burst length of 4, a gap occurs between the burst cycles and hence the reduction efficiency degrades.

Further, since products having different numbers of I/O terminals (4, 8, 16, 32, etc.) are formed of a single chip, it is necessary to contrive a method for reduction can be executed even on a product having a minimum number of I/O terminals. In the case of a product having four I/O terminals and the burst length of 8, it is sufficient if a reduction method that satisfies b=2 and i=4 is employed. From another standpoint in selection, there is a case where the above selection is not the best one.

A method for reducing two banks and four I/O terminals, using both the bank reduction and the I/O terminal reduction, will be considered.

Figure 13A:
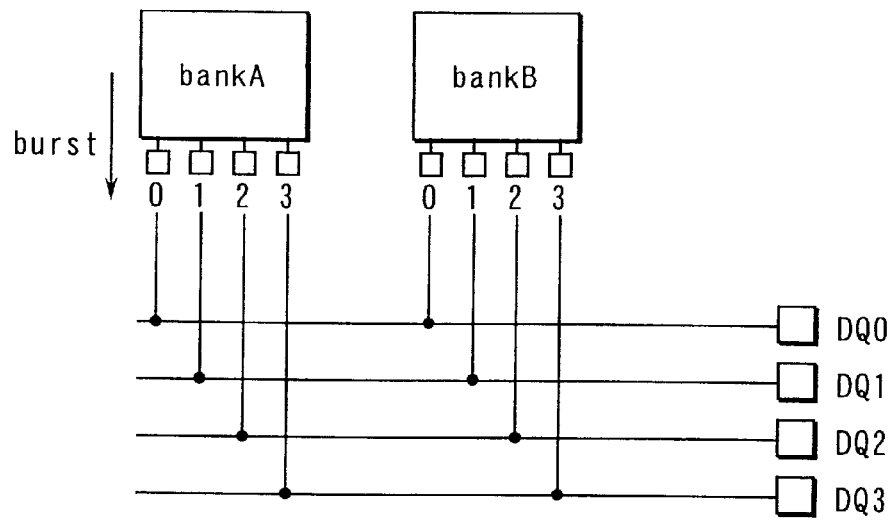
FIGS. 13A, 13B and 13C are views illustrating a connection relationship between I/O terminals and data buses in an SDRAM in normal mode, reduction test mode and search mode.
Figure 13B:
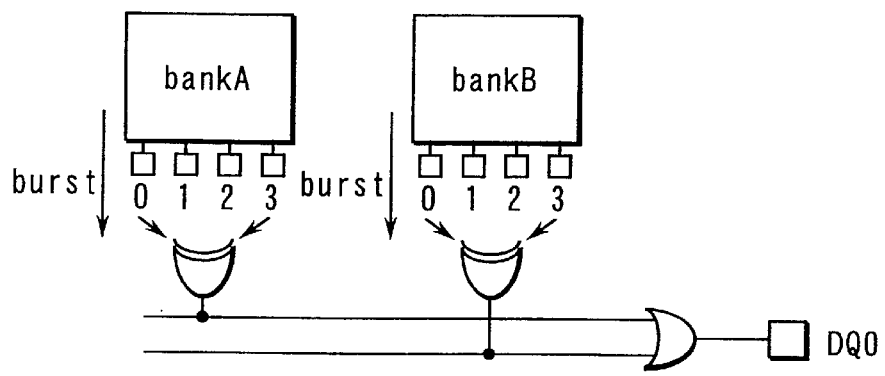
Figure 13C:
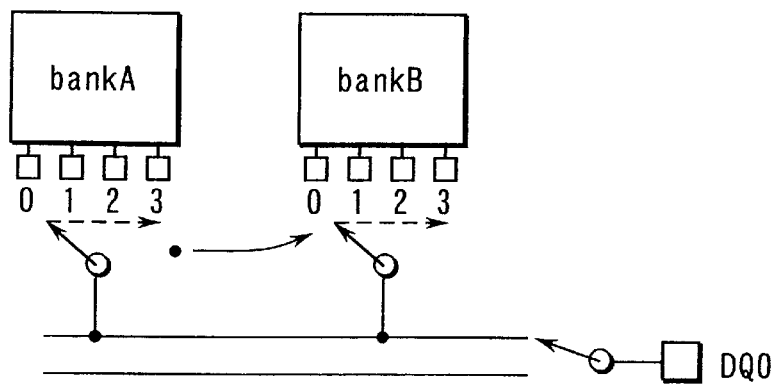

A description will be given of reduction test mode and search mode employed for a basic SDRAM having four I/O terminals and two banks as shown in FIGS. 13A–13C. The number of banks employed in an SDRAM is generally 4, and the two of the four banks, which are reduced, will now be considered.

As shown in FIG. 13A, during the normal operation, data items 0–3 are transferred from the respective I/O terminals of banks A and B to four data buses directed to four DQ terminals, i.e. DQ0, DQ1, DQ2 and DQ3 terminals. At this time, the banks A and B do not simultaneously transfer data. Therefore, corresponding I/O terminals of the banks A and B are connected to the same bus. During the burst operation, data is transferred from one of the banks A and B.

As shown in FIG. 13B, during the reduction test, the Exclusive OR (XOR) of data items output from the four I/O terminals of each of the banks A and B is output as 1-bit data. Since the banks A and B are formed of independent cell arrays that operate independently of each other during the normal operation, data reduction cannot be executed directly between the banks A and B. However, each bank has its own I/O terminals and hence can execute reduction therein to thereby obtain the XOR of data items at the I/O terminals.

Accordingly, respective data items (reduction data items) obtained by reducing the I/O terminals of the banks A and B are transferred to respective buses and have their logical sum (OR) calculated in a position immediately before the DQ0 terminal for transferring data to the outside of the chip. As a result, data for monitoring the XOR result of reduction data in each bank is output from the DQ0 terminal. In other words, if the reduction data items of the banks A and B are not identical to each other, "1" is output.

The burst transfer of data is simultaneously executed in the banks A and B. If "1" is output in reduction test and it is determined that failed data exists, and if the bank and the I/O terminal, which include the failed data, are determined, the examination of the entire chip or almost all defectiveness analyses can be performed using the reduction test. This is because the other address information is not reduced.

FIG. 13C shows the switching of the I/O terminals executed in search mode for searching for each reduced data item. In the search mode, if an address corresponding to failed data is input, burst data items including the failed data are output in the order of the I/O terminals and the banks. FIG. 13C shows an example of a switching operation.

First, in the bank A, data items at the I/O terminals 0–3 are serially output via a single data bus. Subsequently, the data bus is switched to the bank B, thereby outputting data items at the I/O terminals 0–3 of the bank B. Thus, 8-bit data is output in burst mode.

The reason why two data buses are used in the reduction test shown in FIG. 13B is that a description has been given of only two of the four banks. Actually, however, all the four data buses shown in FIG. 13A are used for the four banks.

Figure 14:
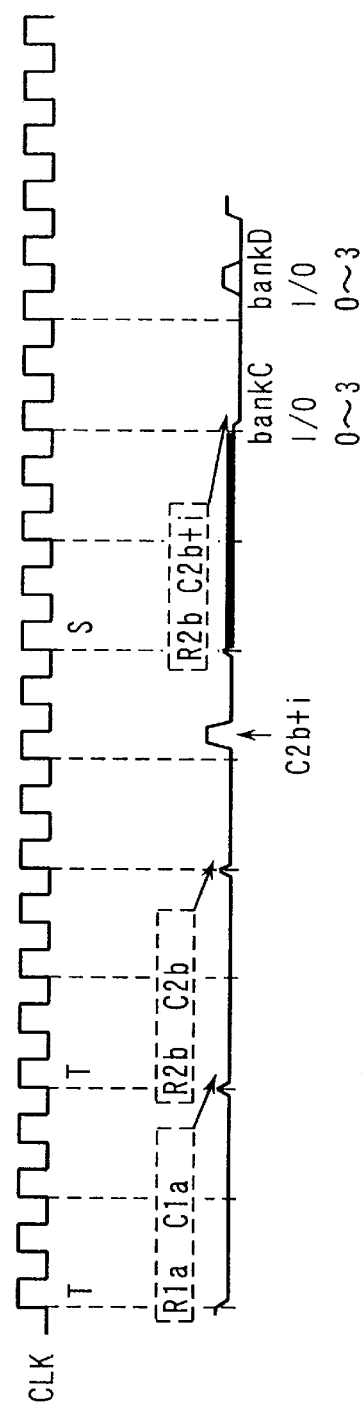
FIG. 14 is a timing chart useful in explaining an example of a test executed using both the reduction test mode and the search mode.

FIG. 14 shows an example of a test mode in which both the reduction test mode and the search mode are used. In each cycle indicated by reference letter T, a row address is input for the reduction test. "1" included in Ra1 or Ca1 denotes the banks A and B subjected to reduction in FIG. 13B. Further, "2" included in Ra2 or Ca2 denotes banks C and D which are the remaining two of the aforementioned four banks and subjected to reduction.

First, data output in burst mode is subjected to reduction test. In this case, addresses R2*b* and C2*b*+i are detected as failed addresses. The failed addresses are stored in a tester, and a search mode operation is executed at a certain point in time using the failed addresses stored in the tester. When executing the search mode operation, the row address R2*b* corresponding to the failed data is input in a cycle indicated by reference letter S, and the column address C2*b*+i is input two cycles after. After latency of two cycles, data items at the I/O terminals 0–3 of the bank C are output, and then data items at the I/O terminals 0–3 of the bank D are output. As a result, data of 8 bits, in total, is output.

Supposing that "0" is written as to-be-reduced data, it can be understood, from the position of an I/O terminal at which "1" is output, that failed data has occurred at the I/O terminal 1 of the bank D in the case of FIG. 14. In the search mode, when a failed data item exists in the data for which "1" is output after its reduction test, it is sufficient that only an address assigned to the data is subjected to restoration from reduction, thereby determining the failed data item.

A description will be given of a case where the number of the I/O terminals is 16. Since, in this case, the memory capacity and the number of the I/O terminals are both large, each bank is formed of, for example, two cell arrays and the I/O terminals are accordingly divided into, for example, two groups, so as to minimize the number of buses running in parallel.

Figures 15, 16:
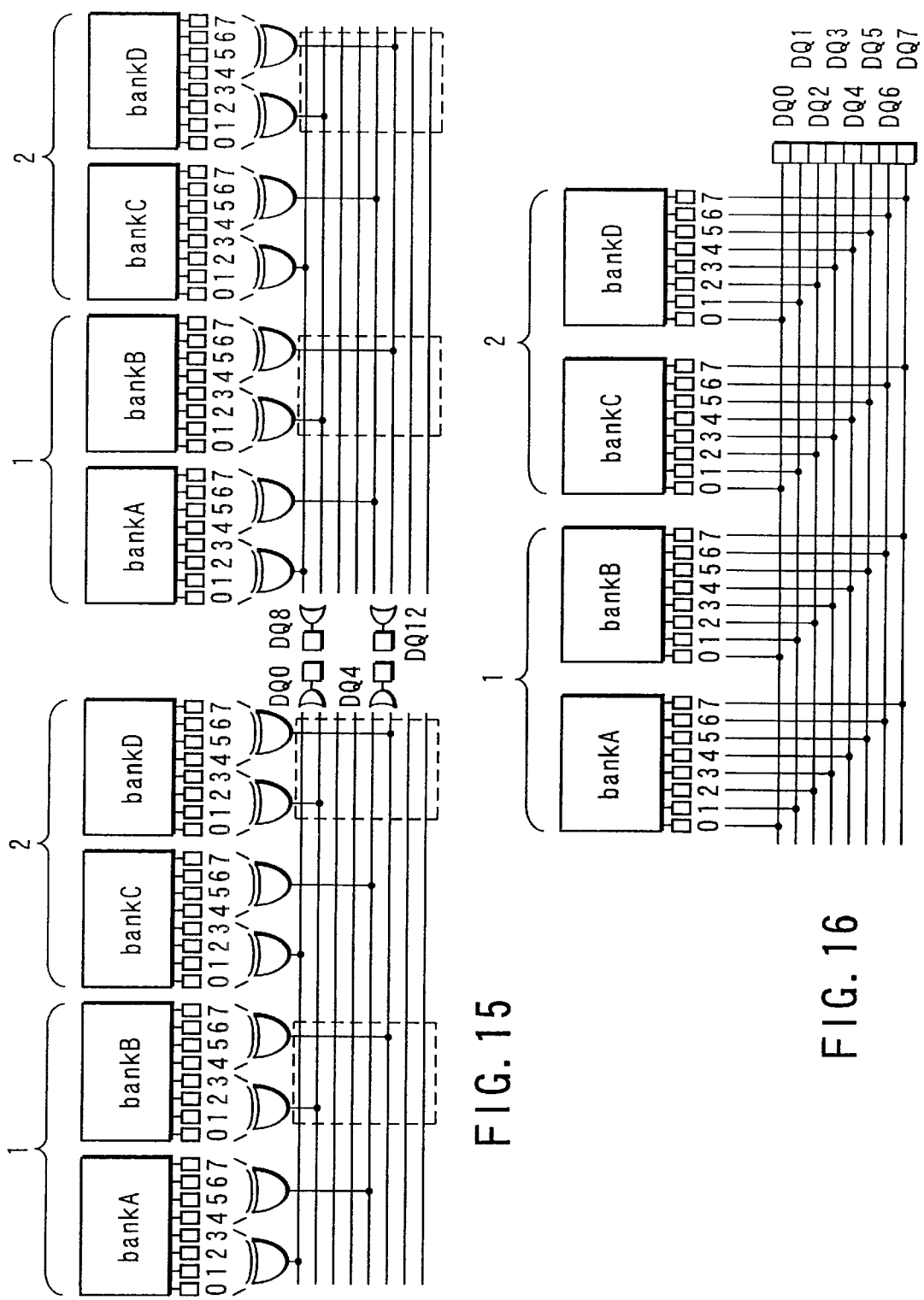
FIG. 15 is a view illustrating a connection relationship between I/O terminals and data buses.
FIG. 16 is a view of banks and I/O terminals in the normal mode included in the left-hand block of FIG. 15.

FIG. 15 shows such a case. Each of the four banks consists of two cell array sections arranged in line. Each cell array has eight I/O terminals, and hence the two cell arrays have sixteen I/O terminals in total. FIG. 15 shows a reduction method, while FIG. 16 shows banks in the normal state, which correspond to the left-hand four banks in FIG. 15, and also shows their I/O terminal structure. Since banks in the normal state corresponding to the right-hand four banks in FIG. 15 have the same structure as above, they are not shown in FIG. 16. Each bank has eight I/O terminals, and corresponding I/O terminals of the banks are connected to respective common data buses. In this state, data is transferred to each common bus in a time-division manner.

Since two banks are reduced in the reduction test, if the four banks are subjected to reduction, a two-bank structure is created apparently. In the case of FIG. 15, new bank 1 is created from the banks A and B, while new bank 2 is created from the banks C and D. In FIG. 15, reduced data is transferred to terminals DQ0, DQ4, DQ8 and DQ12. The method of reduction employed in this case is similar to that shown in FIGS. 13A–13C.

Figure 17A:
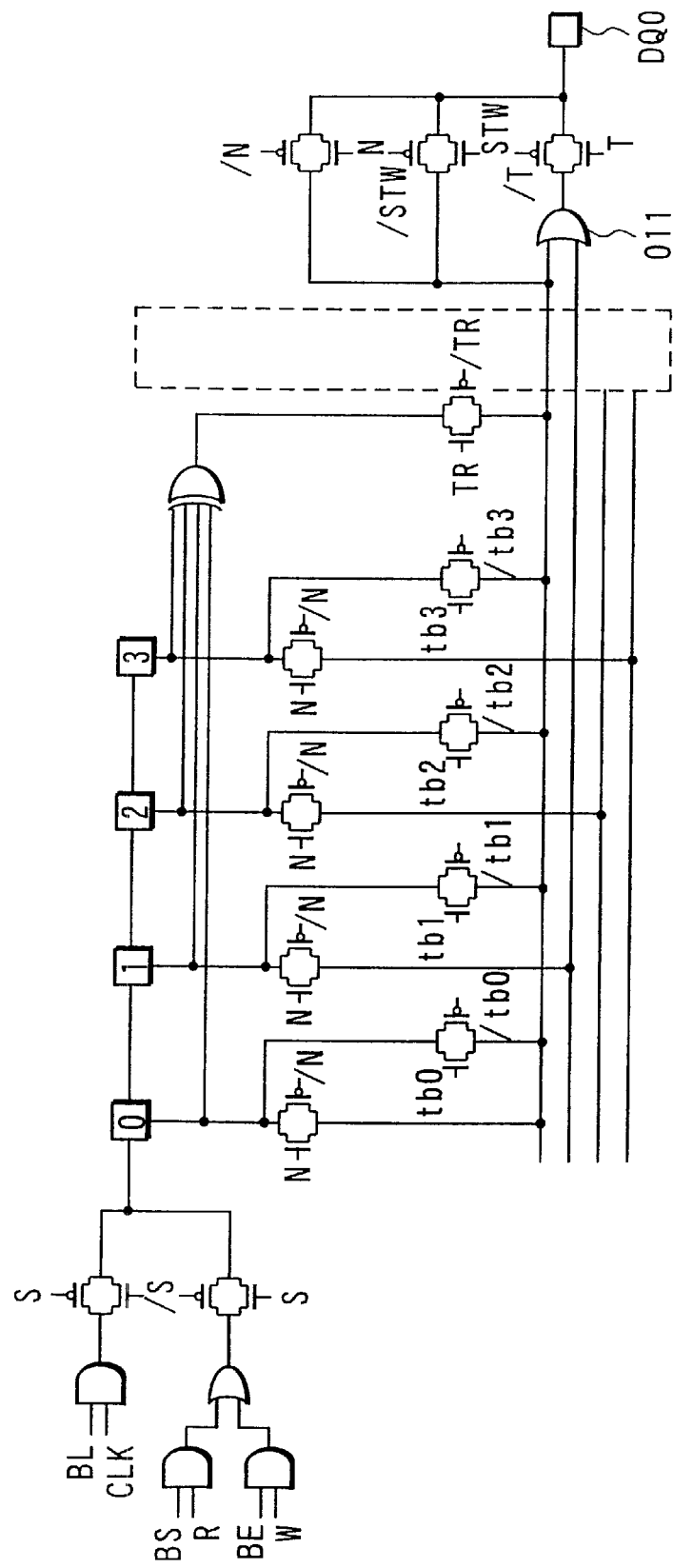

FIGS. 17A–17E show, in detail, circuits for switching the connection of the I/O terminals to the data buses in the structure of FIG. 15 between the normal mode, the reduction test mode and the search mode. FIG. 17A shows data buses to which the reduced I/O terminals 0–3 of the bank A or C shown in FIG. 15 are connected. The connection relationship between the I/O terminals of the bank B or D is not shown since it is similar to the above except that the data buses used for the bank B or D differ from those for the bank A or C. Further, the same can be said of the other I/O terminals 4–7, and therefore no description is given thereof. In FIG. 17A, the sections indicated by the square-enclosed numerals 0–3 are provided for amplifying and latching data from the cell array. These latch sections execute different latch timing control in different modes. FIGS. 17B–17E show circuits for generating signals for controlling the data buses shown in FIG. 17A.

A signal for controlling the latch timing control will be described. Since signal S is set at "H" only in the search mode, logical multiplication (AND) of signal BL and clock CLK is performed in the normal mode and the reduction test mode, thereby executing latch timing control based on the logical multiplication result. The signal BL is set at "H" during the cycle of data burst transfer. Accordingly, during the burst cycle, data is read from or written into the cell array in synchronism with the clock CLK. In the normal mode, signal N is set at "H", and latched data is transferred to each data bus. Pad DQ0 for outputting reduction data, shown in FIG. 17A, receives data output from the I/O terminal 0.

In the reduction test mode, as shown in FIG. 17D, both signals T and R are set at "H", and hence signal TR rises to "H". The XOR output section of the I/O terminals 0–3 is connected to one of the buses connected to a logical sum (OR) circuit O11 that leads to the output pad of reduction data. To the other bus connected to the OR circuit O11, the XOR output section of the I/O terminals of the other bank B or D is connected. Finally, the output of the OR circuit O11 is supplied as reduction data to the pad DQ0.

When executing data writing in the test mode, the same data is simultaneously written into all reduction data buses. At this time, signals W and R are set at "H" and "L", respectively. As a result of the AND output of the signals T and W, outputs tb0–tb7 rise to "H". Further, since signal STW rises to "H", data input to the pad is transferred to a corresponding bus, thereby simultaneously transferring the same data to the I/O terminals 0–3. Data items output from the I/O terminals 0–3 are latched in synchronism with the clock and serially transferred to the cell array in burst mode.

In the search mode, data writing and data reading can be executed. When executing data reading, data items transferred from the cell array are latched by the latch sections controlled by the AND output of signal BS that rises to "H" only in the leading clock cycle of a data burst output operation, and the signal R that indicates the reading operation. After that, the data items latched by the latch sections are sequentially transferred to data buses.

The sequential transfer executed in synchronism with the clock is controlled by the shift register outputs b0–b7. In the search mode, the output b0 is set at "H" in the leading clock cycle of the data burst output operation, and at "L" in the next cycle. The output b1 is set at "H" of b0 in synchronism with the trailing edge of the clock pulse, and at "L" of b0 in synchronism with the trailing edge of the next clock pulse. Thus, the level "H" is transferred sequentially, and all the outputs return to "L" when the data burst output operation has finished.

Since the outputs bj overlap each other by half cycle, the AND output of the clock CLK (or complementary clock /CLK) and the signal bj is obtained in order to create signals tbj that are accurately switched from one to another in units of half cycle. In the serial mode, since the signal STW is at "H" in accordance with the "H" level of the signal S, a certain data bus is connected to the reduction test pad, thereby sequentially restoring the reduced I/O terminal data items into original ones and transferring them. Data items output in the last half of the data burst output operation are transferred to the section indicated by the broken line in FIG. 17A, on the basis of control signals output from the section of the shift registers indicated by the broken line in FIG. 17E. This section corresponds to the sections of, for example, the bank B indicated by the broken lines in FIG. 15.

When executing data writing in the search mode, different data items can be written into reduced I/O terminals of the same address and a corresponding bank. During the data writing, latching is controlled by the AND output of signal BE that rises to "H" only in the last clock cycle of a data burst input operation, and the signal W indicating that the writing operation is being executed. The data items sequentially latched by the latching circuits via the data buses are simultaneously transferred to the cell array.

Figure 18:
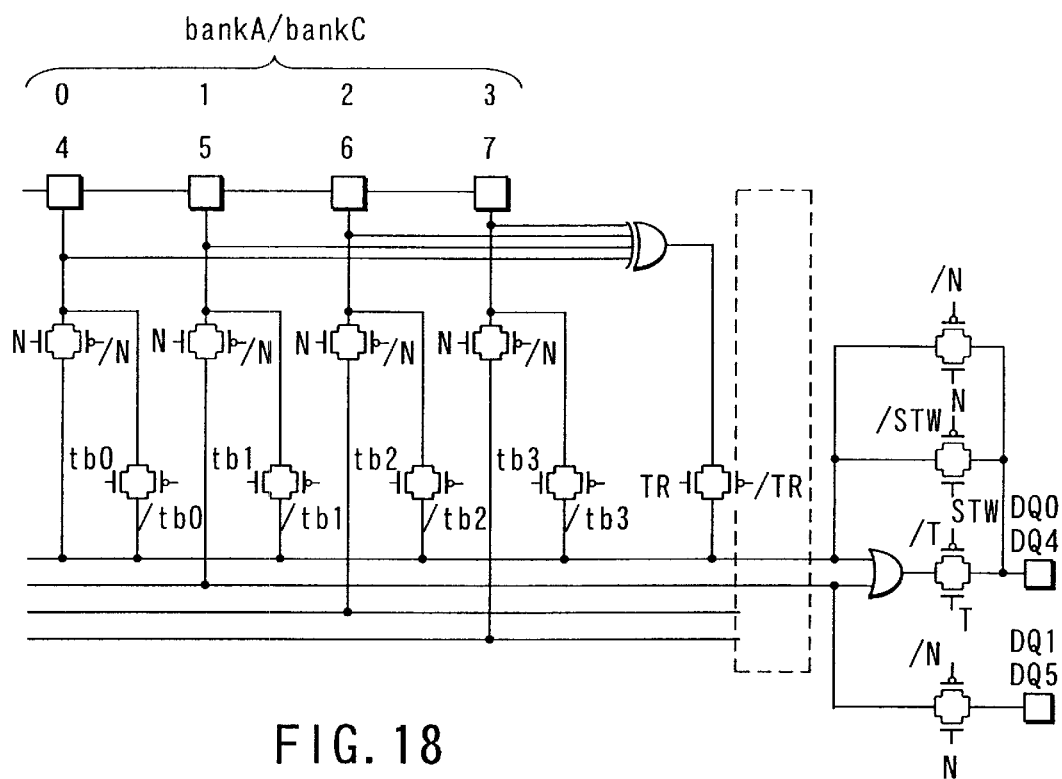
FIG. 18 is a circuit diagram showing a connection relationship between banks A and C shown in FIG. 17A and data buses.
Figure 19:
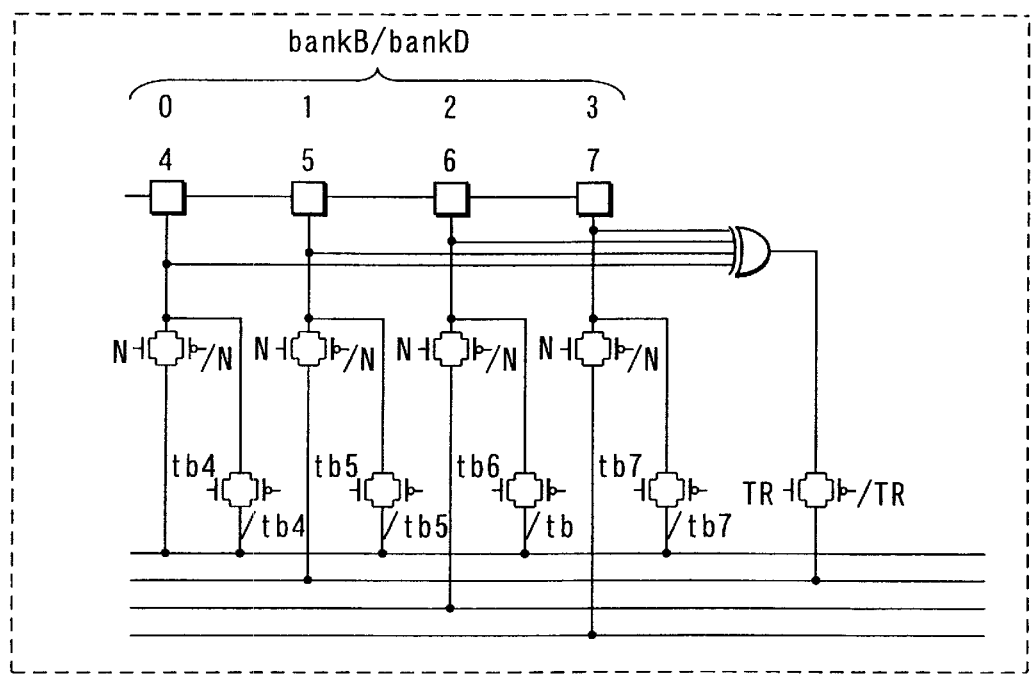
FIG. 19 is a circuit diagram showing a connection relationship between banks B and D shown in FIG. 17A and data buses.

A description will now be given of the relationship between the connection of data buses to a pad in the normal mode, the reduction test mode and the search mode, and the data burst operation executed in the search mode, with reference to FIG. 15. FIGS. 18 and 19 are views similar to FIG. 17A, illustrating connection to data buses. The pads corresponding to data buses used in the reduction test mode are pads DQ0, DQ1, DQ4 and DQ5. The relationship in connection between the data latch circuits and those pads is shown.

FIG. 18 shows the I/O terminals 0–3 and 4–7 of the bank A or C included in the left-hand block in FIG. 15. The circuit shown in FIG. 19 corresponds to the section indicated by the broken line in FIG. 18, and includes the I/O terminals 0–3 and 4–7 of the bank B or D. In the search mode, since the outputs tb0–tb7 are sequentially selected, the pair of reduced banks A and B or C and D are restored to the original ones, and at the same time, their reduced I/O terminals are restored to the original ones. During the time in which the former four bits of the data burst are output, the data items at the I/O terminals 0–3 of the bank A or C are serially read from the pad DQ0, and the data items at the I/O terminals 4–7 of the bank A or C are serially read from the pad DQ4. Further, during the time in which the latter four bits of the data burst are output, data items at the I/O terminals 0–3 of the bank B or D are serially read from the pad DQ0, and data items at the I/O terminals 4–7 of the bank B or D are serially read from the pad DQ4.

Figure 20A:
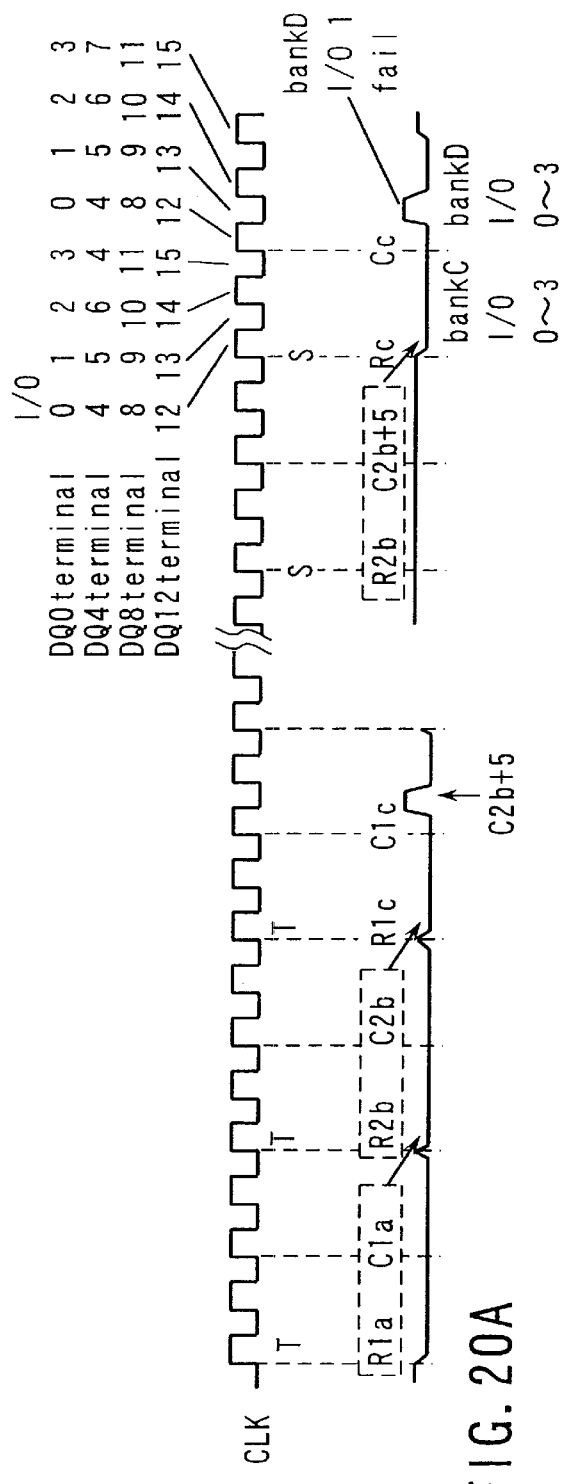
FIGS. 20A and 20B are views illustrating the relationship between data and a data burst operation executed in the structure of FIG. 15.
Figure 20B:
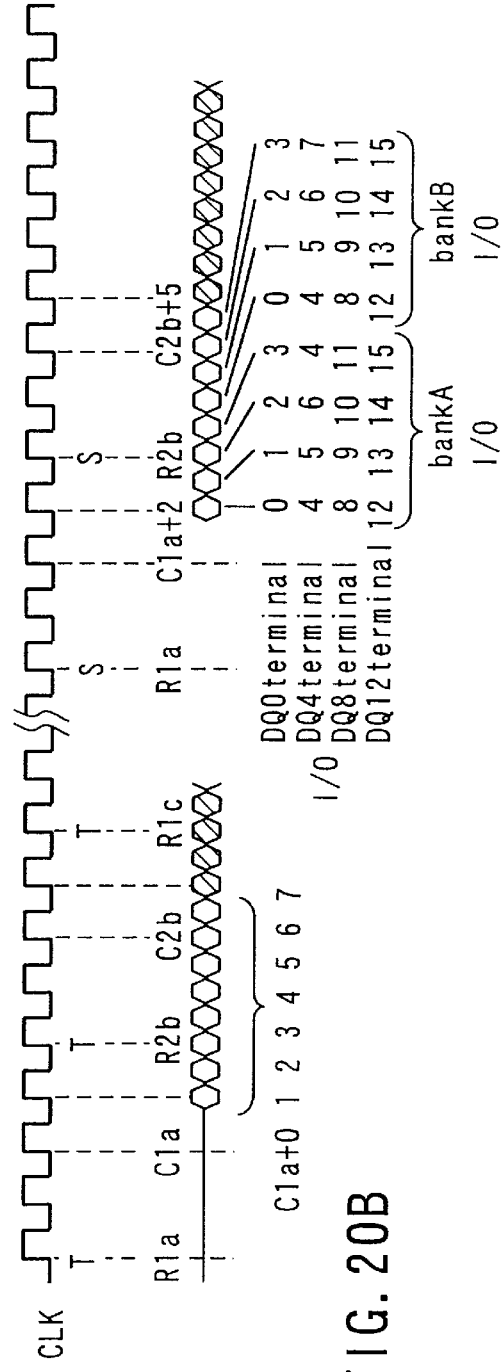

FIGS. 20A and 20B are views illustrating the relationship between a data burst operation and data.

In the case shown in FIG. 20A, in a cycle indicated by reference letter T, a row address for the reduction test is input. "1" included in, for example, R1$a$ or C1$a$ denotes the banks A and B subjected to reduction in FIG. 15. Further, "2" included in, for example, R2$b$ or C2$b$ denotes banks C and D which are the remaining two of the aforementioned four banks and subjected to reduction.

First, data output in burst mode is subjected to reduction test, thereby detecting failed addresses. The failed addresses are stored in a tester, and a search mode operation is executed at a certain point in time using the failed addresses stored in the tester.

FIG. 20A shows a state of data at the pad DQ0. As shown, data "1" is output at a row address R2$b$ and a column address C2$b$+5 of the reduced bank 2, i.e. the bank C or D. This means that a failed cell exists. To detect the failed bank and I/O terminal, a search mode operation is executed. In a cycle indicated by reference letter S in FIG. 20A, the failed row address R2$b$ is input, and the column address C2$b$+i is input two cycles after. After latency of two cycles, data items at the I/O terminals 0–3 of the bank C are output, and then data items at the I/O terminals 0–3 of the bank D are output. As a result, data of 8 bits, in total, is output.

Supposing that "0" is written as to-be-reduced data, it can be understood, from the position in which "1" is output, that failed data has occurred at the I/O terminal 1 of the bank D in the case of FIG. 20A. FIG. 20A also shows the relationship between burst cycles and the I/O terminals connected to the other pads DQ in the search mode.

FIG. 20B shows the relationship between data writing and a data burst input operation. Common row data is supplied to reduced I/O terminals and banks in each cycle T, and a common leading column address assigned to data to be input in burst mode is supplied to them two cycles after, thereby writing 8-bit data in burst mode. Although this is the same writing as in the case of an SDRAM using the usual DDR, the case of FIG. 20B differs from the SDRAM in that common data is written into reduced I/O terminals and banks in each burst cycle (the burst cycle indicates a cycle in which a predetermined amount of data is written in burst mode). This data is compared with data read as an expected value, when determining a failed bank and I/O terminal after restoring the reduced banks and I/O terminals to the original ones using the search mode.

Data writing in the search mode beginning from cycle S shown in FIG. 20B_indicates that data writing in the search mode can realize the same processing as usual writing without reduction.

In the case of FIG. 20B, at first, common row address $\underline{a}$ (Ra) in reduced bank 1 (i.e. the pair of banks A and B) is designated. Subsequently, column address $\underline{a+2}$ (C1$a$+2) is designated, thereby writing data in each burst cycle. As a result, data input from the input pad is written into the banks A and B via each I/O terminal, as shown in FIG. 20B. In this case, the I/O terminals and banks are scanned, which differs from the usual burst writing process wherein cells corresponding to the column address are scanned.

Figure 21:
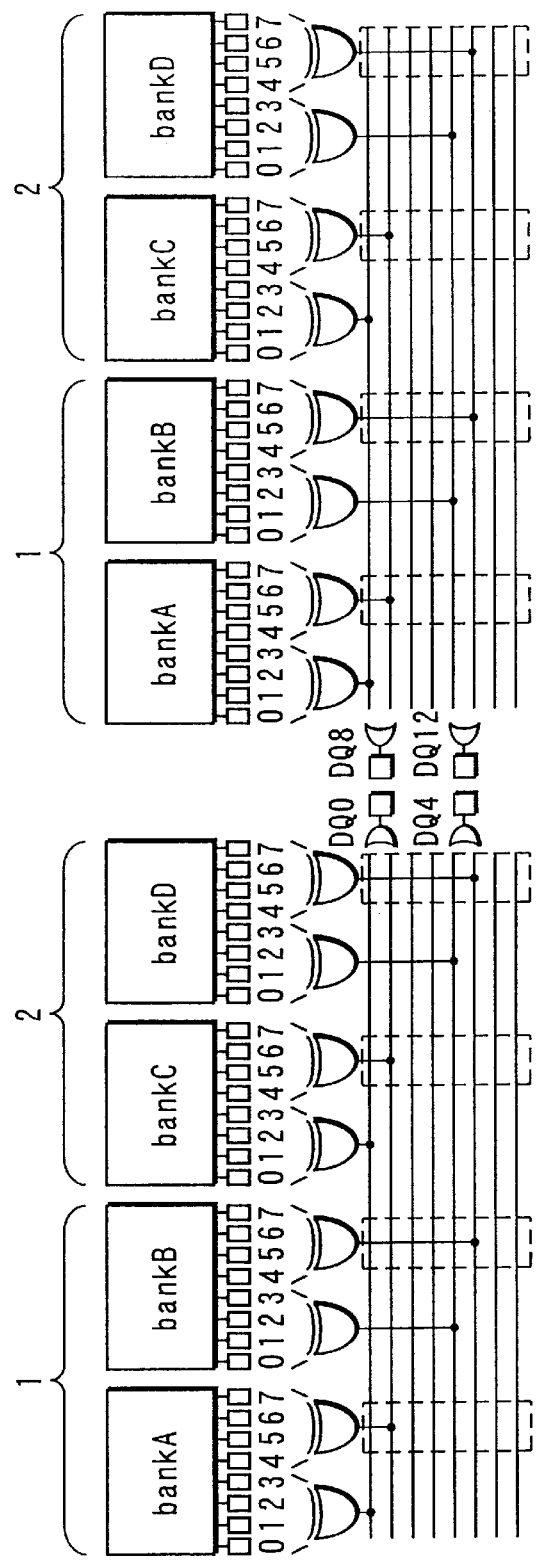
FIG. 21 is a view showing another connection relationship between I/O terminals and data buses.

In the above case, data burst is realized by scanning data input from a single pad to banks and I/O terminals. FIG. 21 illustrates another connection relationship between I/O terminals and data buses. In this case, data burst is realized by scanning data input from a single pad to I/O terminals only.

Figure 22:
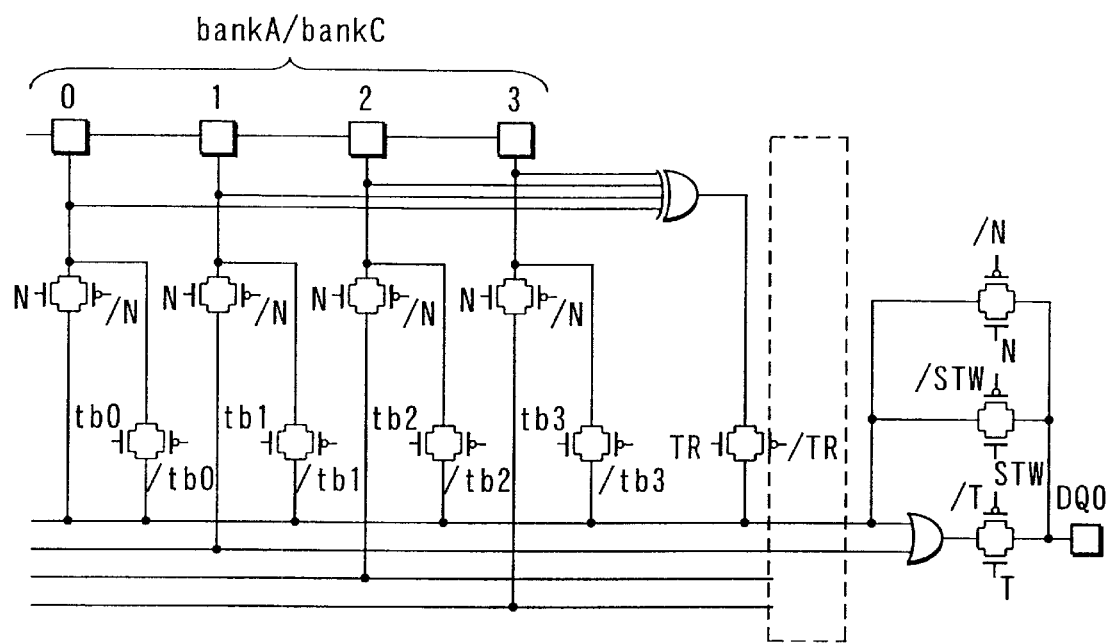
FIG. 22 is a circuit diagram showing part of a connection relationship between banks A and C shown in FIG. 21 and data buses.
Figure 23:
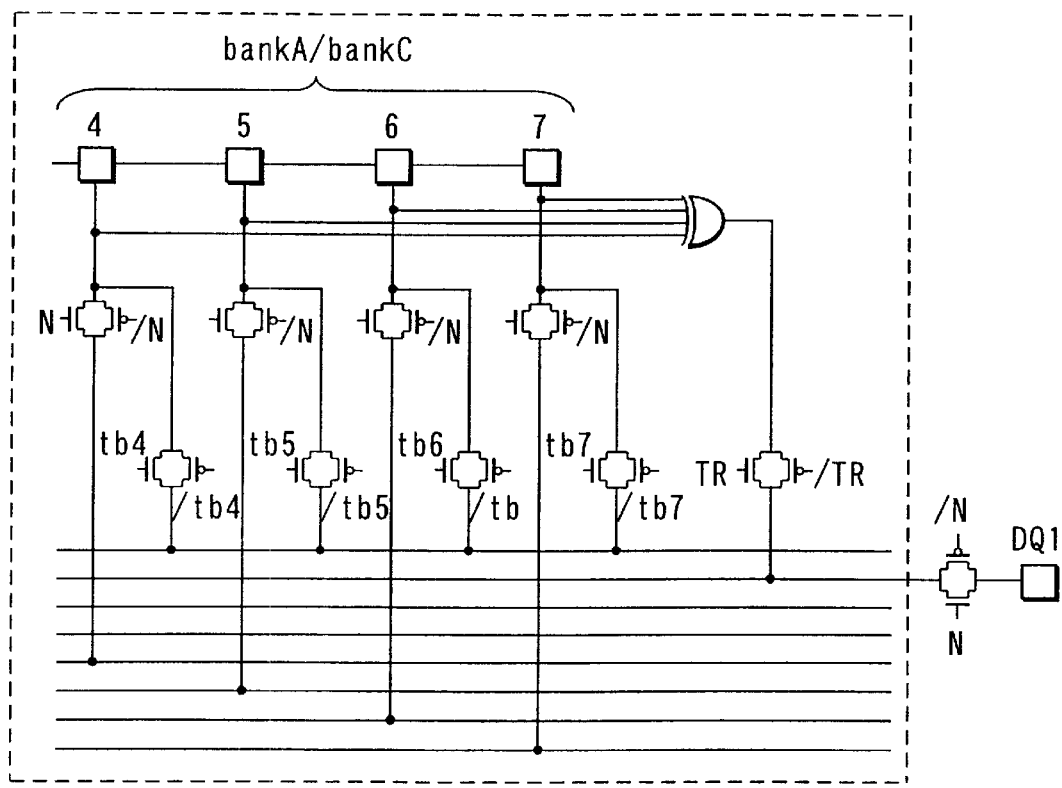
FIG. 23 is a circuit diagram showing the other part of a connection relationship between the banks A and C shown in FIG. 21 and the data buses.

The case of FIG. 21 differs from the case of FIG. 15 in that in the former, reduced data is distributed to banks reduced in units of a corresponding output pad. FIGS. 22 and 23 show data distributions corresponding to pads DQ0 and DQ1 (shown in FIG. 16), respectively.

The section indicated by the broken line in FIG. 22 is shown in detail in FIG. 23. In the case of FIG. 22, when sequentially selecting outputs tb0–tb7 in the search mode, data at the I/O terminals 0–7 of the bank A or C is output as burst data from the DQ0. The relationship between data and a data burst operation executed in this structure is shown in FIGS. 24A and 24B that correspond to FIGS. 20A and 20B, respectively.

Figure 24A:
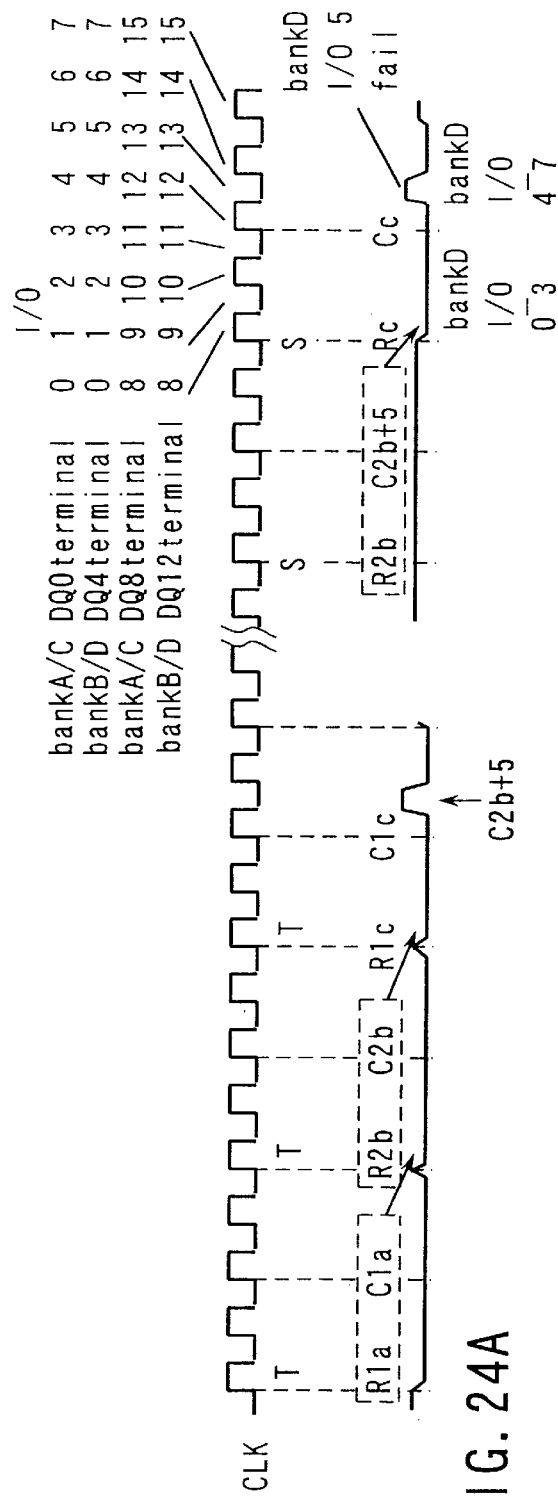
FIGS. 24A and 24B are views illustrating the relationship between data and a data burst operation executed in the structure of FIG. 21.
Figure 24B:
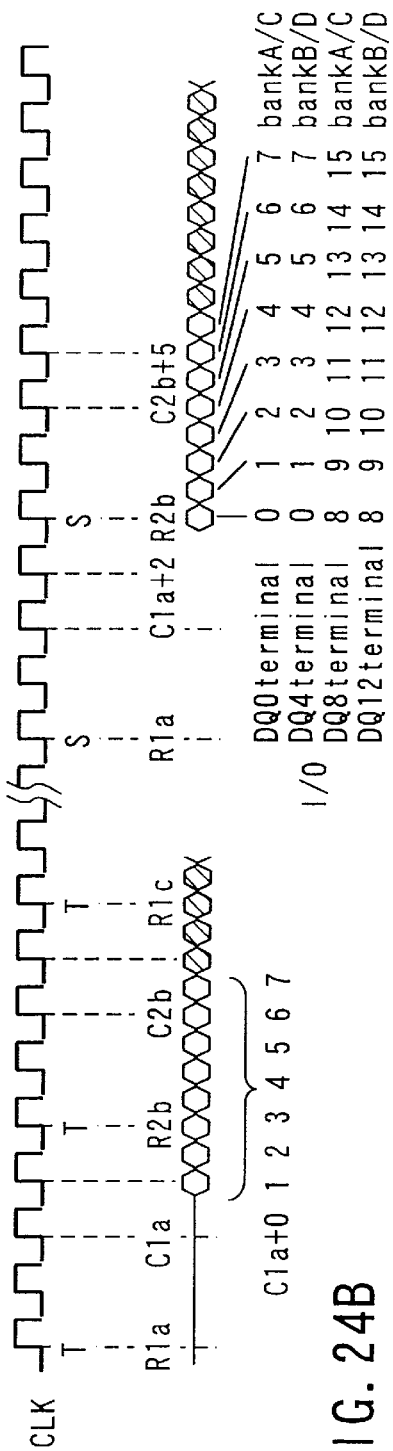

The reduction test mode process executed in cycle T in FIG. 24A is similar to that of FIG. 20A. FIG. 24A shows data burst at the pad DQ4. In the data structure in the search mode, failed data is found in reduced bank 2. In other words, failed data exists in the bank C or D. Since the DQ4 corresponds to the bank D, as is evident from FIG. 21, data items at the I/O terminals 0–7 of the bank D are sequentially output in burst mode. Supposing that the expected data value is "0", data at an I/O terminal corresponding to a clock cycle in which "1" is output is failed. Accordingly, in the case of FIG. 24A, it is determined that data at the I/O terminal 5 in the bank D is failed. FIG. 24A shows I/O terminals connected to each DQpad. FIG. 24B shows data writing in the reduction test mode and the search mode. FIG. 24B differs from FIG. 20B only in that in the former, the I/O terminals are scanned for data writing in the search mode.

As described above, the second embodiment can significantly reduce the time required for searching for a failed address when replacing one or two failed bits with the anti-fuses. Thus, the anti-fuse system can be used without much increasing the time for testing.

The above-described embodiments establish a method for executing a reduction test with a high data transfer efficiency using a data burst operation, and for searching for a failed address. This method enables execution of testing in a short time and efficient replacement of failed bits in a packaged product with anti-fuses, without increasing the cost, thereby increasing the yield of good products.

The above-described embodiments of the present invention is constructed as below.

The electric fuse unit of an embodiment of the present invention is characterized in that a pair of anti-fuses formed of, for example, capacitors to which power is applied to thereby increase their leak currents, and the leak currents are compared with each other to thereby determine the way of applying power, which is used as information for programming the fuses.

Further, a fuse box including a plurality of fuse units is divided into two blocks of fuse units. In one of the blocks, information as to whether or not the fuse box is valid as a system is programmed. In the other block, address bits indicating to-be-replaced cells are programmed if the system is determined to be valid.

Moreover, the fuse box is determined to be valid if the fuses of the one block for determining the validity are all in a predetermined programmed state. If the fuse box is determined to be invalid, bit data that differs by only one bit from the programmed pattern is programmed in the fuse box.

The programming or reading of the fuse units of the fuse box is executed serially in units of one bit. The reading of data from the fuse box is executed when the chip is turned on, and the data is stored and used as failed address bit data during the operation of the chip.

In order to use the system after chips are packaged, the number of chips that can be estimated simultaneously is increased, and the total address access time is reduced by inputting the same address into the chips, thereby enabling efficient detection of a failed address to be replaced with redundancy bits. Furthermore, in order to easily detect a failed address, the following functions and structures are provided.

Usually, the number of I/O terminals to be actually used is reduced to a smaller number of I/O terminals so as to input/output the same data to/from them, thereby reducing the number of terminals to be tested and thus increasing the number of chips that can be tested simultaneously.

A plurality of banks in a chip are simultaneously activated to input/output the same data to/from them, thereby reducing the number of occasions of access to addresses for data input/output and reducing the time required for the test.

A failed address is obtained as the OR information of data items obtained from a plurality of I/O terminals and banks. In order to restore a reduced failed address and obtain an actual address, a test mode and a data bus switching mechanism are provided, which enable serial input/output, in order, of data included in reduced data corresponding to the failed address.

As described above, an aspect of the present invention can provide a redundancy circuit and a redundancy system, which use anti-fuses whose programmed states can be determined reliably irrespective of their broken states. Moreover, an aspect of the present invention can provide, without adding any other process to the process of manufacturing a DRAM, a redundancy circuit and a redundancy system, which use anti-fuses consisting of elements that are incorporated in the DRAM and can have stable programmed states.

In addition, an aspect of the present invention can provide a failed address searching method for efficiently determining a failed address necessary for storing fuse-programmed states in the redundancy circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device including a memory cell array in which a plurality of memory cells are arranged, comprising:

first and second programmable resistance elements whose electrical resistances are variable;

an amplifier receiving a voltage signal based on a difference between the electrical resistances of the first and second programmable resistance elements, amplifying the voltage signal and outputting a resultant signal;

a memory circuit storing the resultant signal from the amplifier; and a switch circuit configured to connect and disconnect the amplifier to and from the memory circuit.

2. The semiconductor memory device according to claim 1, wherein the switch circuit disconnects the amplifier from the memory circuit after the memory circuit receives the resultant signal from the amplifier.

3. The semiconductor memory device according to claim 2, wherein each of the first and second programmable resistance elements has first and second electrodes, the first electrode being connected to a first power supply terminal via a first transistor and the second electrode being connected to a power supply terminal via a second transistor.

4. The semiconductor memory device according to claim 3, wherein each of the first and second programmable resistance elements contains a capacitor.

5. A semiconductor memory device including a memory cell array in which a plurality of memory cells are arranged, comprising:

first and second programmable resistance elements whose electrical resistances are variable;

a differential amplifier receiving voltage signals each determined by the electrical resistance of each of the first and second programmable resistance elements, amplifying a difference between the voltage signals and outputting a resultant signal;

a memory circuit storing the resultant signal from the differential amplifier; and a switch circuit configured to connect and disconnect the differential amplifier to and from the memory circuit.

6. The semiconductor memory device according to claim 5, wherein the switch circuit disconnects the differential amplifier from the memory circuit after the memory circuit receives the output from the differential amplifier.

7. The semiconductor memory device according to claim 6, wherein each of the first and second programmable resistance elements has first and second electrodes, the first electrode being connected to a first power supply terminal via a first transistor and the second electrode being connected to a second power supply terminal via a second transistor.

8. The semiconductor memory device according to claim 7, wherein each of the first and second programmable resistance elements contains a capacitor.

* * * * *